(12) United States Patent
Kasuga et al.

(10) Patent No.: US 10,469,774 B2
(45) Date of Patent: Nov. 5, 2019

(54) IMAGING APPARATUS AND CAMERA SYSTEM INCLUDING THE IMAGING APPARATUS

(71) Applicant: PANASONIC INTELLECTUAL PROPERTY MANAGEMENT CO., LTD., Osaka (JP)

(72) Inventors: Shigetaka Kasuga, Osaka (JP); Tsuyoshi Tanaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/121,972

(22) Filed: Sep. 5, 2018

(65) Prior Publication Data
US 2019/0020836 A1   Jan. 17, 2019

Related U.S. Application Data

(63) Continuation of application No. PCT/JP2017/014186, filed on Apr. 5, 2017.
(Continued)

(51) Int. Cl.
*H04N 5/355* (2011.01)
*H04N 5/235* (2006.01)
(Continued)

(52) U.S. Cl.
CPC ..... *H04N 5/35545* (2013.01); *H01L 27/1461* (2013.01); *H01L 27/1464* (2013.01);
(Continued)

(58) Field of Classification Search
CPC ............ H04N 5/35545; H04N 5/3532; H04N 5/37452; H04N 5/341; H04N 5/378;
(Continued)

(56) References Cited

U.S. PATENT DOCUMENTS

| 8,817,143 B2 * | 8/2014 | Murata | H04N 5/3745 348/241 |
| 9,036,064 B2 * | 5/2015 | Kasuga | H01L 27/14643 348/300 |

(Continued)

FOREIGN PATENT DOCUMENTS

WO    2014/097519 A1    6/2014

OTHER PUBLICATIONS

Partial European Search Report dated Mar. 8, 2019 issued for the corresponding EP Patent Application No. 17785793.5.
(Continued)

*Primary Examiner* — Padma Haliyur
(74) *Attorney, Agent, or Firm* — McDermott Will & Emery LLP

(57) ABSTRACT

An imaging apparatus changes a multiplication factor of an avalanche photodiode (APD) at one of (i) a first timing subsequent to an exposure period of a first frame in a first vertical scanning period and a readout period of the first frame in a second vertical scanning period, and previous to an exposure period of a second frame in a third vertical scanning period, and (ii) a second timing subsequent to an exposure period of the first frame in the first vertical scanning period, and previous to a readout period of the first frame and an exposure period of the second frame which are provided in parallel in the second vertical scanning period.

16 Claims, 23 Drawing Sheets

Related U.S. Application Data

(60) Provisional application No. 62/325,621, filed on Apr. 21, 2016.

(51) Int. Cl.

| | | |
|---|---|---|
| *H04N 5/243* | (2006.01) | |
| *H01L 27/146* | (2006.01) | |
| *H01L 31/107* | (2006.01) | |
| *H04N 5/341* | (2011.01) | |
| *H04N 5/353* | (2011.01) | |
| *H04N 5/378* | (2011.01) | |
| *H04N 5/3745* | (2011.01) | |
| *G01J 1/44* | (2006.01) | |

(52) U.S. Cl.
CPC .. *H01L 27/14612* (2013.01); *H01L 27/14643* (2013.01); *H01L 31/107* (2013.01); *H04N 5/2355* (2013.01); *H04N 5/243* (2013.01); *H04N 5/341* (2013.01); *H04N 5/3532* (2013.01); *H04N 5/3535* (2013.01); *H04N 5/35572* (2013.01); *H04N 5/378* (2013.01); *H04N 5/37452* (2013.01); *G01J 2001/4466* (2013.01)

(58) Field of Classification Search
CPC .. H04N 5/3535; H04N 5/35572; H04N 5/243; H04N 5/2355; H01L 31/107; H01L 27/1464; H01L 27/14612; H01L 27/1461; H01L 27/14643; G01J 2001/4466
See application file for complete search history.

(56) References Cited

U.S. PATENT DOCUMENTS

| | | | |
|---|---|---|---|
| 2005/0224903 | A1 | 10/2005 | Augusto et al. |
| 2011/0085064 | A1 | 4/2011 | Nishide |
| 2012/0154656 | A1 | 6/2012 | Oike et al. |
| 2012/0162373 | A1 | 6/2012 | Mheen et al. |
| 2014/0376930 | A1* | 12/2014 | Shiba .................. H04B 10/671 398/212 |
| 2015/0124132 | A1 | 5/2015 | Mabuchi et al. |
| 2015/0156387 | A1 | 6/2015 | Miyakoshi |
| 2015/0256774 | A1 | 9/2015 | Nishihara |
| 2015/0281620 | A1 | 10/2015 | Usuda et al. |
| 2018/0331246 | A1* | 11/2018 | Nada ................. H01L 31/03046 |

OTHER PUBLICATIONS

Extended European Search Report issued in corresponding European Patent Application No. 177857935, dated May 10, 2019.
International Search Report and Written Opinion, dated Jun. 27, 2017 in International (PCT) Application No. PCT/JP2017/014186; with partial English translation.

* cited by examiner

RESET (EXPOSURE START)

READOUT (EXPOSURE STOP)

FIG. 17

| RESET DRAIN VRSD | RESET H VOLTAGE | TRAN H VOLTAGE | WELL VOLTAGE VWELL |
|---|---|---|---|
| APD MODE 5 V | APD MODE 5 V | APD MODE 5 V | APD MODE 2 V |
| PD MODE 3 V | PD MODE 3 V | PD MODE 3 V | PD MODE 0 V |

# IMAGING APPARATUS AND CAMERA SYSTEM INCLUDING THE IMAGING APPARATUS

CROSS REFERENCE TO RELATED APPLICATIONS

This application is a U.S. continuation application of PCT International Patent Application Number PCT/JP2017/014186 filed on Apr. 5, 2017, claiming the benefit of priority of U.S. Patent Application No. 62/325,621 filed on Apr. 21, 2016, the entire contents of which are hereby incorporated by reference.

BACKGROUND

1. Technical Field

The present disclosure relates to an imaging apparatus and a camera system including the imaging apparatus.

2. Description of the Related Art

In recent years, there has been a need for a weak light sensor that accurately measures weak light as minute as a single photon in various fields such as medical care, biotechnology, and radiometry. Currently, a photomultiplier tube (PMT) is widely used as the weak light sensor. It is, however, difficult to increase the number of pixels in a PMT because it is a vacuum tube device and even a small PMT has a size of approximately 10 mm×10 mm. In addition, in order to perform imaging using a PMT, it is necessary to perform imaging processing by collecting object information at each point by using a method such as scanning an object in XY plane. For this reason, it is difficult to perform photography in real time. Under the circumstances, there is a strong demand for a solid-state weak light sensor in order to simultaneously implement an increase in the number of pixels in the weak light sensor and an increase in the speed of the weak light sensor.

An imaging apparatus capable of detecting weak light as minute as a single photon often includes an avalanche photodiode as a light receiving element. When photons are incident on the avalanche photodiode, an electron-hole pair is generated. The generated electron and hole are each accelerated at a high electrical field, and the electron and hole sequentially causes collisional ionization like an avalanche to generate a new electron-hole pair. This internal amplification action enhances sensitivity, and thus an avalanche photodiode is often used when weak light detection is required.

The avalanche photodiode operates in a linear mode for causing the avalanche photodiode to operate with a reverse bias voltage being lower than a breakdown voltage, or in a Geiger mode for causing the avalanche photodiode to operate with the reverse bias voltage being higher than the breakdown voltage. In the linear mode, the number of electron-hole pairs which disappear (i.e., which exit the high electrolytic region) is larger than the number of electron-hole pairs which are generated, and thus avalanche phenomenon spontaneously stops. An output current is substantially proportional to the amount of incident light, and thus is used to measure the amount of incident light. In the Geiger mode, a multiplication factor is quite high, and even an incident of a single photon can cause the avalanche phenomenon, and thus the avalanche photodiode is sometimes referred to as a single photon avalanche diode (SPAD). In order to stop the avalanche phenomenon, it is necessary to decrease the reverse bias voltage to be lower than or equal to the breakdown voltage.

For example, the optical detector according to International Publication No. 2014/097519 includes the above-described avalanche photodiode and a readout circuit for use in a CMOS image sensor, and controls a multiplication factor using a voltage applied to the avalanche photodiode.

SUMMARY

The optical detector according to International Publication No. 2014/097519 is capable of controlling the multiplication factor in the avalanche phenomenon. However, International Publication No. 2014/097519 fails to disclose the details such as a timing for controlling the multiplication factor.

In view of the above-described problem, the present disclosure provides an imaging apparatus capable of substantially seamlessly changing a multiplication factor of an avalanche photodiode so as to simultaneously capture scenes in which a dark region and a bright region are mixed, and a camera system which includes the imaging apparatus.

An imaging apparatus according to the present disclosure includes a pixel array in which a plurality of pixels are arranged in rows and columns, and a control circuit. In the imaging apparatus, the pixel array includes: an avalanche photodiode; a charge accumulation portion which accumulates a signal charge generated in the avalanche photodiode; a reset transistor which initializes the charge accumulation portion; a transfer transistor which connects the avalanche photodiode and the charge accumulation portion; and an amplification transistor which converts the signal charge into a voltage. The control circuit is connected to the avalanche photodiode, and changes a multiplication factor of the avalanche photodiode at one of (i) a first timing subsequent to an exposure period of a first frame in a first vertical scanning period and a readout period of the first frame in a second vertical scanning period, and previous to an exposure period of a second frame in a third vertical scanning period, and (ii) a second timing subsequent to an exposure period of the first frame in the first vertical scanning period, and previous to a readout period of the first frame and an exposure period of the second frame which are provided in parallel in the second vertical scanning period.

For example, the control circuit may compare a threshold set in advance and an output value of an image sensor including the pixel array, and change the multiplication factor according to a comparison result.

For example, the control circuit may concurrently change the multiplication factor of each of the plurality of pixels.

For example, when the control circuit changes the multiplication factor at the first timing, the exposure period may be set for each of the rows.

For example, when the control circuit changes the multiplication factor at the first timing, the exposure period may be determined as a period of time during which global driving is concurrently performed on all of the pixels.

For example, the control circuit may change the multiplication factor after every two vertical scanning periods, and output two images alternately one by one, after every two vertical scanning periods, the two images being generated according to the signal charges having different multiplication factors.

For example, the control circuit may change the multiplication factor after every two vertical scanning periods, and combine two images generated according to the signal charges having different multiplication factors into one image, and output the one image.

For example, when the control circuit changes the multiplication factor at the second timing, the pixel array may further include: a memory element disposed between the charge accumulation portion and the amplification transistor; and a read transistor disposed between the charge accumulation portion and the memory element, the exposure period may be common among all of the pixels, and during the exposure period, the read transistor may be off and a signal may be read.

For example, the control circuit may change the multiplication factor after every vertical scanning period, and output two images alternately one by one, after every vertical scanning period, the two images being generated according to the signal charges having different multiplication factors.

For example, the control circuit may change the multiplication factor after every other vertical scanning period, and the imaging apparatus may combine two images generated according to the signal charges having different multiplication factors into one image, and output the one image.

In addition, an imaging apparatus according to another aspect of the present disclosure includes: a pixel array in which a plurality of pixels are arranged in rows and columns; and a control circuit. In the imaging apparatus, the pixel array includes: an avalanche photodiode disposed in a well region; a charge accumulation portion which accumulates a signal charge generated in the avalanche photodiode; a reset transistor which initializes the charge accumulation portion; a transfer transistor which connects the avalanche photodiode and the charge accumulation portion; and an amplification transistor which converts the signal charge into a voltage, and the control circuit controls, on a row basis, a drain potential of the reset transistor, a gate potential of the reset transistor, a gate potential of the transfer transistor, and a potential of the well region.

For example, the control circuit may compare a threshold set in advance and an output value of an image sensor including the pixel array, and change a multiplication factor of the signal charge according to a comparison result.

For example, an exposure period for the avalanche photodiode may be set for each of the rows, a signal may be read for each of the rows after an end of the exposure period, and between an end of a readout period and a start of a next exposure period, the control circuit may change a multiplication factor of the signal charge.

For example, the imaging apparatus may output two images alternately one by one, after every vertical scanning period, the two images being generated according to the signal charges having different multiplication factors.

For example, the imaging apparatus may output one image resulting from combining two images generated according to the signal charges having different multiplication factors.

In addition, a camera system according to the present disclosure includes the imaging apparatus according to the present disclosure, and a signal processing circuit connected to the imaging apparatus. In the camera, the signal processing circuit detects illuminance based on an output from the imaging apparatus, and outputs a signal based on a result of the detecting of the illuminance, to the control circuit.

According to the present disclosure, it is possible to reproduce a wide dynamic range image from a dark object to a bright object, by preparing in advance voltages for a dark environment and a bright environment and seamlessly switching the voltages automatically by an imaging apparatus, in order to capture an image irrespective of whether the environment in which the image is captured is dark or bright.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 17 is a diagram which illustrates an example of voltage values according to Embodiment 2.

DETAILED DESCRIPTION OF THE EMBODIMENTS

Hereinafter, embodiments according to the present disclosure shall be described in detail with reference to the Drawings. It should be noted that the embodiments described below each show one preferred specific example of the present disclosure. The numerical values, shapes, materials, structural components, the arrangement and connection of the structural components, steps, the processing order of the steps, etc. described in the following embodiments are mere examples, and therefore do not limit the scope of the present disclosure. Furthermore, among the structural components in the following embodiments, structural components not recited in any one of the independent claims indicating the broadest concepts of the present disclosure are described as arbitrary structural components included in a more preferred embodiment.

Embodiment 1

First, a unit pixel circuit included in imaging apparatus 100 according to the present embodiment will be described, with reference to FIG. 1. It should be noted that in the specification and the diagrams, a floating diffusion is denoted as an FD which is an abbreviated expression. Pixel circuit 110 included in imaging apparatus 100 according to the present embodiment receives an incident photon by an avalanche photodiode, accumulates electric charges generated by the received photon into the FD, and amplifies a potential of the FD in the state by a source follower circuit to output.

Figure 1:
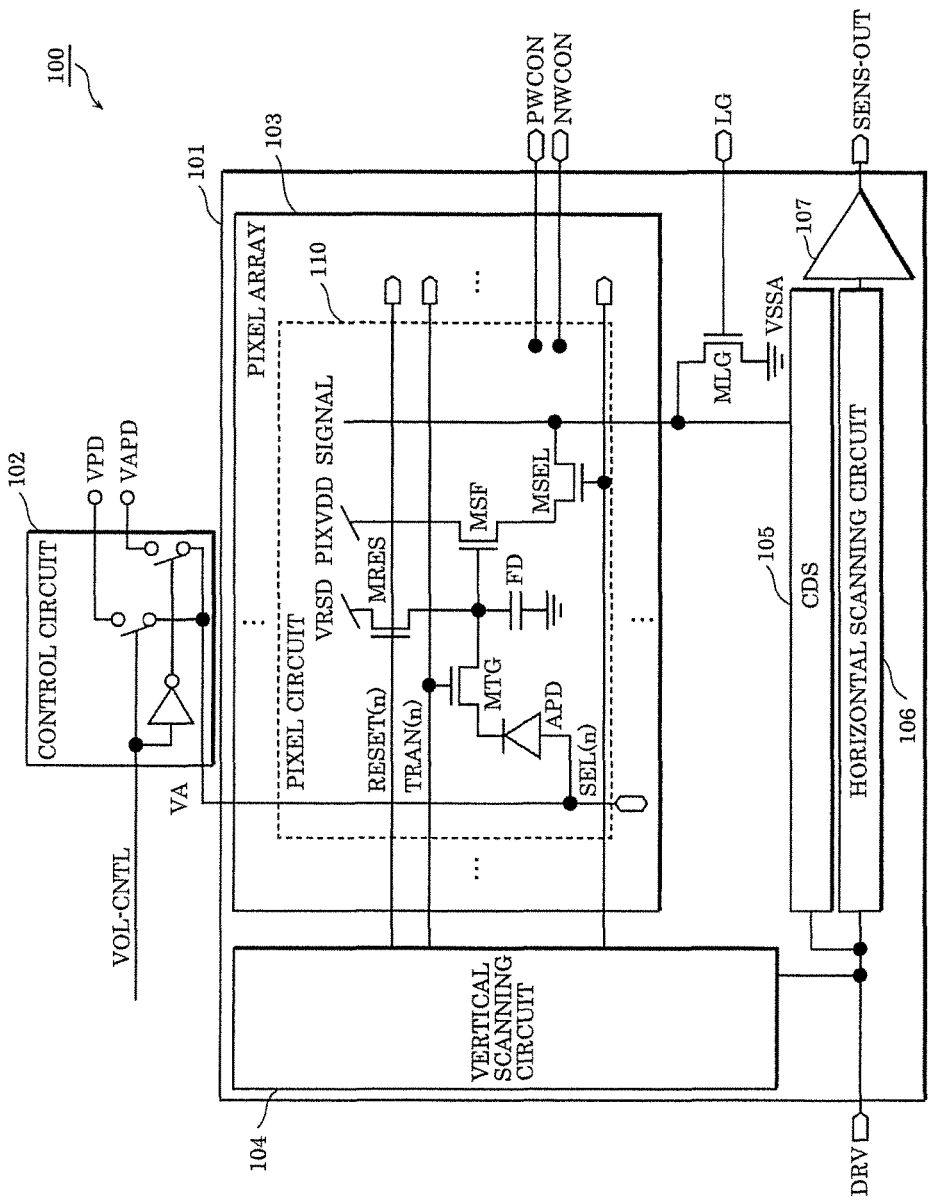
FIG. 1 is a circuit block diagram of an imaging apparatus according to Embodiment 1.

As illustrated in FIG. 1, imaging apparatus 100 includes image sensor 101 and control circuit 102. Image sensor 101 includes pixel array 103, vertical scanning circuit 104, correlated double sampling circuit (CDS) 105, horizontal scanning circuit 106, and output amplifier 107. Pixel array 103 includes a plurality of pixel circuits 110 arranged in rows and columns. The plurality of pixel circuits 110 each include: avalanche photodiode APD; reset transistor MRES; transfer transistor MTG; amplification transistor MSF; row selecting transistor MSEL; and an FD.

Reset transistor MRES sets a potential of the FD to reset drain potential VRSD, thereby initializing the FD. Transfer transistor MTG connects avalanche photodiode APD and the FD. The source follower circuit includes pixel power supply PIXVDD, amplification transistor MSF, and load transistor MLG. The source follower circuit amplifies the potential of the FD according to the electric charges accumulated in the FD, and outputs the amplified potential. As a result of turning on row selecting transistor MSEL, a pixel signal is out from a vertical signal line SIGNAL. It should be noted that, it is possible, without row selecting transistor MSEL, to drive imaging apparatus 100 according to the present embodiment.

Vertical scanning circuit 104 outputs reset signal RESET for controlling reset transistor MRES, transfer signal TRAN for controlling transfer transistor MTG, and row select signal SEL for controlling row selecting transistor MSEL, in order of the nth row, the n+1th row, and the n+2th row.

It should be noted that, in pixel circuit 110, any or all of the various transistors including reset transistor MRES and amplification transistor MSF may be shared in the unit pixel.

Control circuit 102 is connected to an anode of avalanche photodiode APD. Control circuit 102 is a voltage switch, and changes a multiplication factor of avalanche photodiode APD. According to the present embodiment, control circuit 102 outputs, to avalanche photodiode APD, either voltage VPD for capturing an image without performing avalanche multiplication or voltage VAPD for capturing an image by performing avalanche multiplication. In some cases, the former is referred to as a non-avalanche multiplication mode, and the latter is referred to as an avalanche multiplication mode. Hereafter, voltage VPD and voltage VAPD are collectively referred to as voltage VA in some cases. In the present embodiment, the difference between voltage VAPD and voltage VPD is assumed to be 2 V in the following description. For example, voltage VPD is −25 V and voltage VAPD is −27 V. In addition, breakdown voltage VBD of avalanche photodiode APD is −26 V, for example. Here, |VPD|<|VBD|, and |VAPD|>|VBD|. It should be noted that control circuit 102 may include not only two types of power supplies; that is, voltage VPD and voltage VAPD, but also three or more types of power supplies according to the application.

The configuration of control circuit 102 is not limited to the configuration described in the present embodiment, but may be any configuration as long as the multiplication factor of avalanche photodiode APD can be changed. For example, avalanche photodiode APD may be connected to a single power supply, and control circuit 102 may determine a voltage to be supplied to avalanche photodiode APD from the single power supply. In addition, although control circuit 102 is separately provided outside image sensor 101 according to the present embodiment, control circuit 102 may be provided inside image sensor 101.

Figure 2:
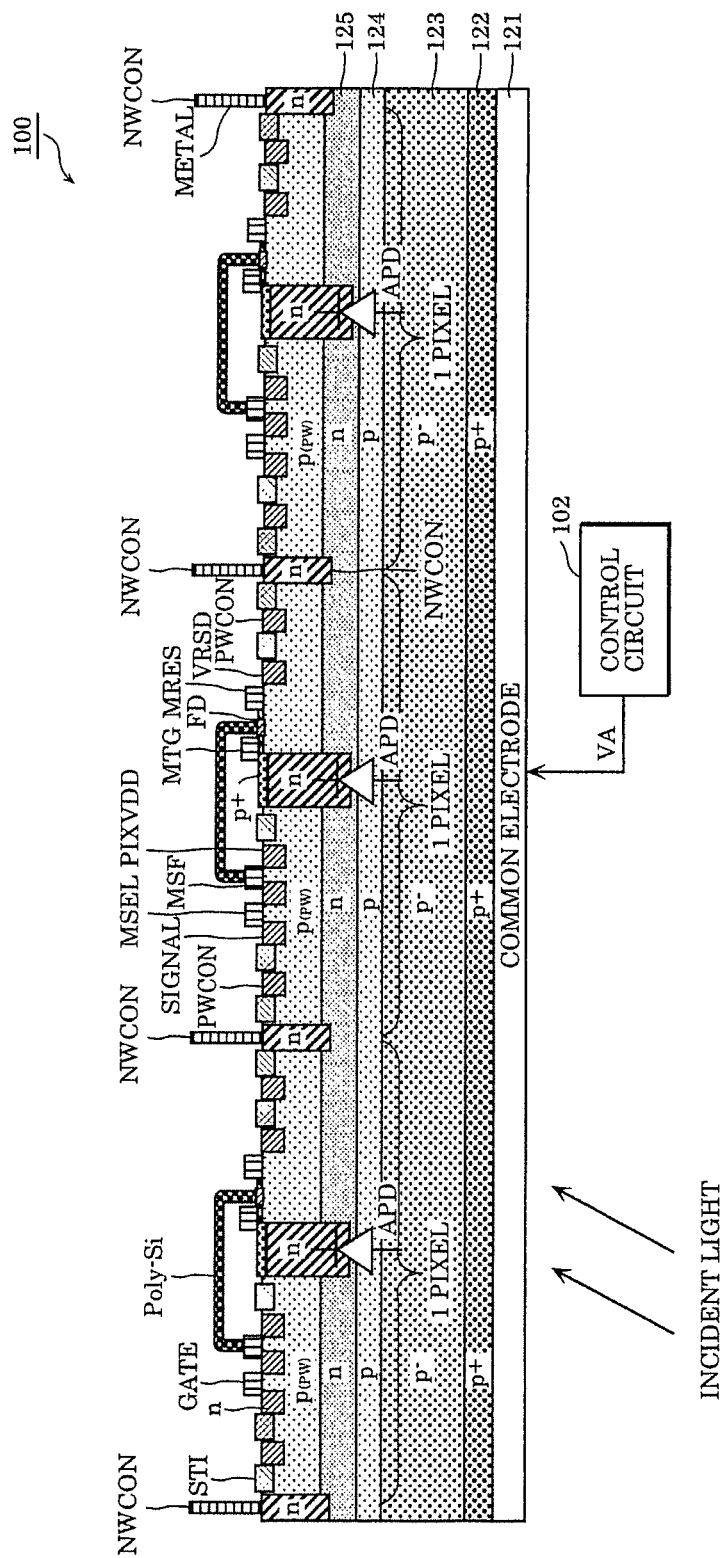
FIG. 2 is a cross-sectional diagram of the imaging apparatus according to Embodiment 1.

FIG. 2 is a cross-sectional diagram of pixel circuit 110 illustrated in FIG. 1. In the diagram, common electrode 121 is a metal electrode. Control circuit 102 applies voltage VAPD or voltage VPD described above, to common electrode 121. Light is incident on imaging apparatus 100 from a lower side of the cross-sectional diagram; that is, from a side of common electrode 121 opposite to p+ layer 122. Then, the light is photoelectrically converted sequentially in p+ layer 122 and p-layer 123, by the power supply application described above. Furthermore, p layer 124 and n layer 125 form avalanche photodiode APD. Electric charges accumulated in n layer 125 are subsequently transferred to the FD via transfer transistor MTG. It should be noted that, with regard to the conductive type of each of the semiconductor layers, p-type and n-type may be switched.

Figure 3:
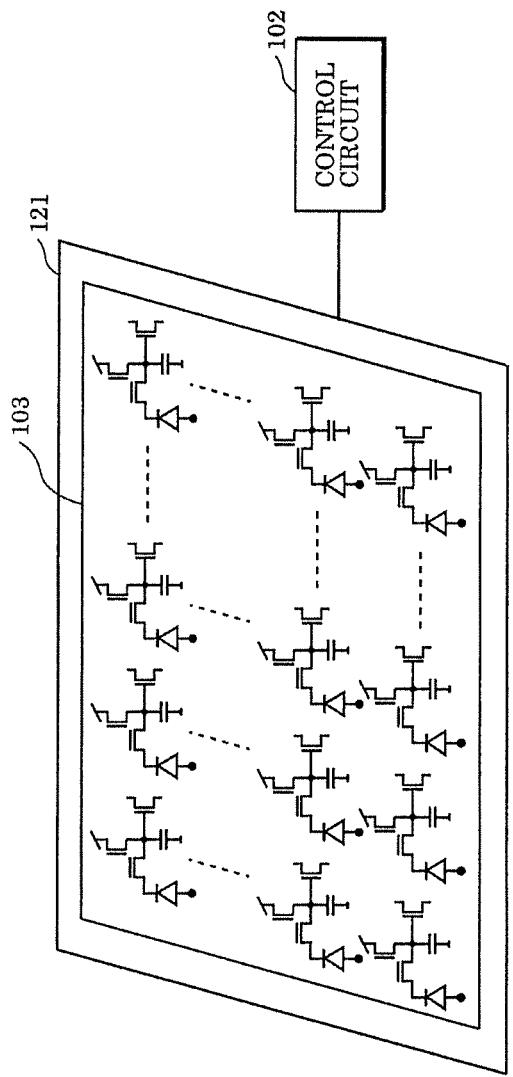
FIG. 3 is a schematic diagram related to changing a voltage of a common electrode according to Embodiment 1.
Figure 4:
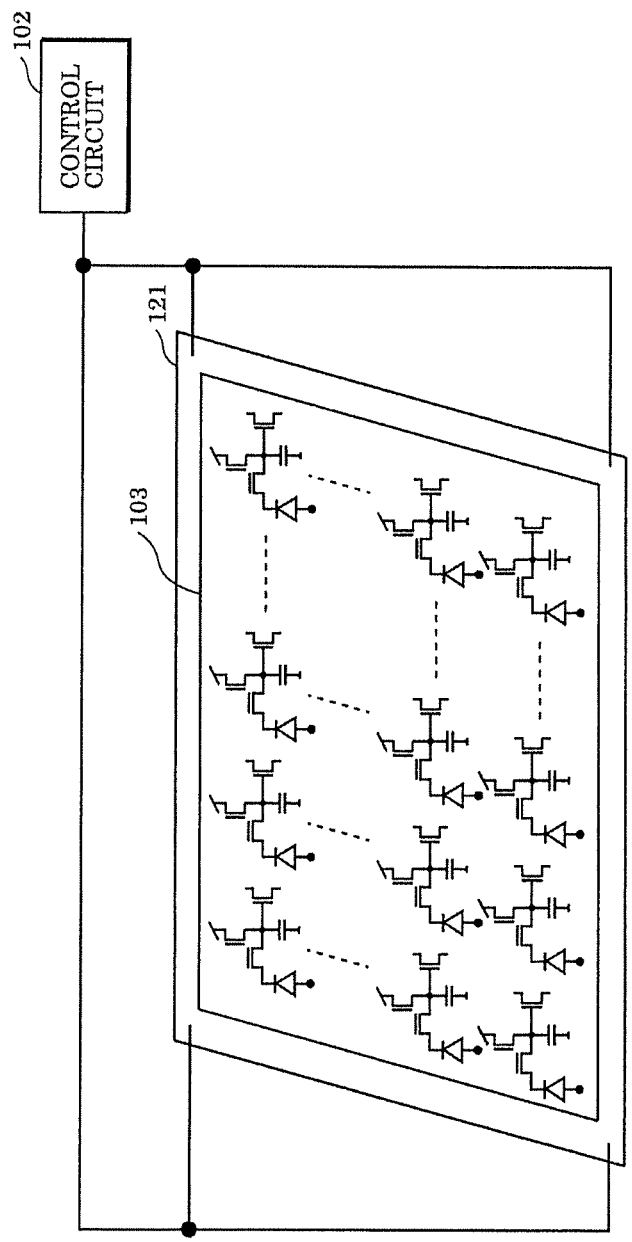
FIG. 4 is a schematic diagram related to changing a voltage of a common electrode according to Embodiment 1.

As illustrated in FIG. 3, voltage VA is supplied to the entirety of p+ layer 122 of the pixel area via common electrode 121 from control circuit 102. As illustrated in FIG. 4, in order to evenly apply voltage VA to the entirety of pixel array 103, it is preferable that voltage VA is applied in four directions (from the four corners, for example) of pixel array 103.

Figure 5:
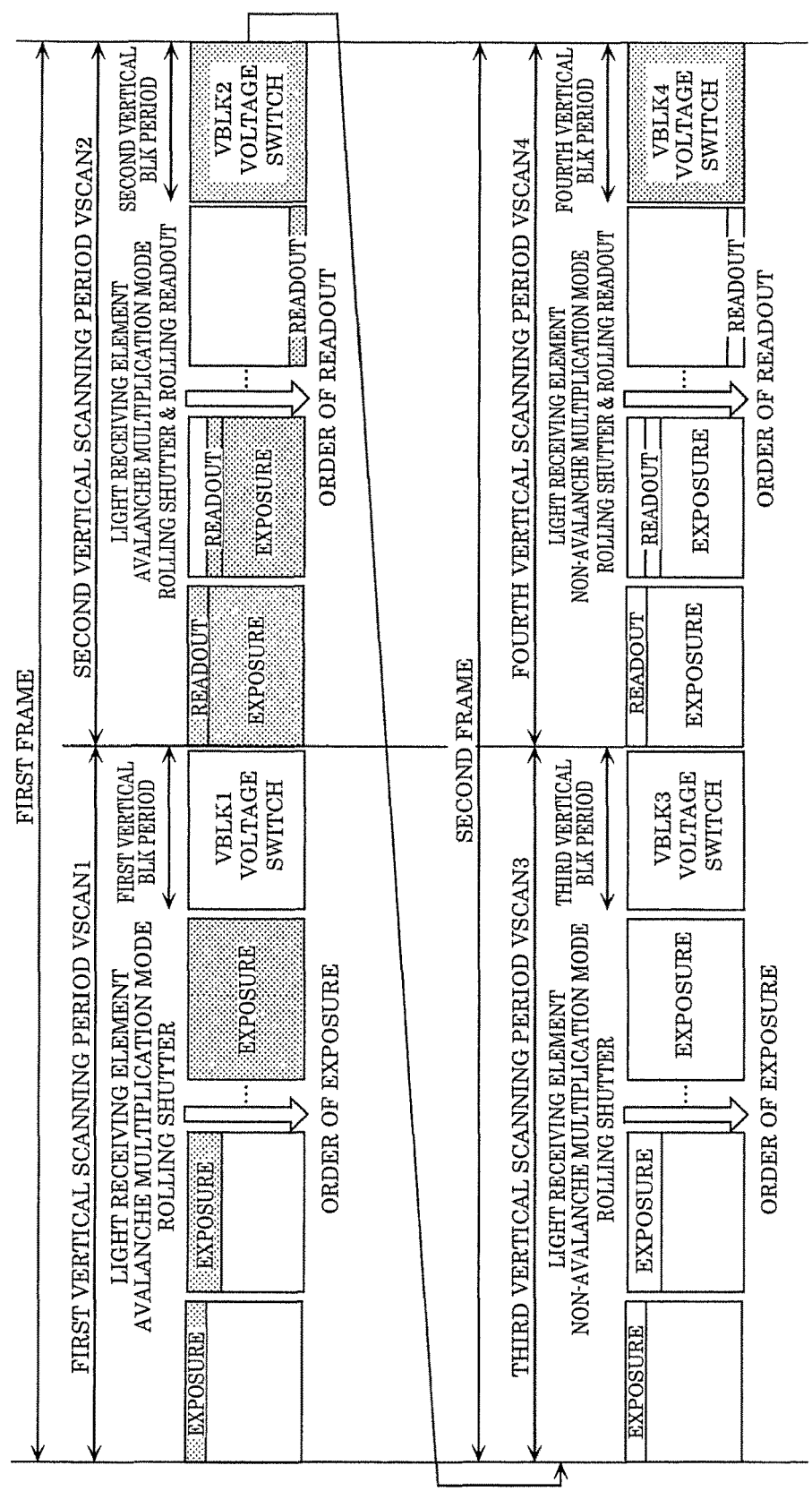
FIG. 5 is a schematic diagram related to an example of driving the imaging apparatus according to Embodiment 1.

Next, a timing for switching (changing) voltage VA which is applied to avalanche photodiode APD will be described with reference to FIG. 5. FIG. 5 is a diagram which illustrates a driving example when voltages of all of the pixels are switched to perform rolling exposure. In this case, the power supply cannot be switched until signals of all of the pixels are output after the exposure, and thus two vertical scanning periods correspond to one frame.

First, in the first vertical scanning period VSCAN 1, a signal output from vertical scanning circuit 104 causes the pixels to start to be exposed in the order of the nth row, the n+1th row, and the n+2th row (rolling). When exposure is started in all of the rows; that is, in all of the pixels, first vertical blanking period VBLK 1 starts.

Next, in the second vertical scanning period VSCAN 2, a signal output from vertical scanning circuit 104 causes the exposure to end in the order of the nth row, the n+1th row, and the n+2th row, and the electric charges accumulated in the pixels are read by a source follower circuit. When the readout of all of the pixels is completed, second vertical blanking period BLK 2 starts.

At this time, in second vertical blanking period BLK 2, control circuit 102 switches voltage VA which is applied to avalanche photodiode APD, to voltage VAPD for causing avalanche photodiode APD to operate in avalanche multiplication or voltage VPD for causing avalanche photodiode APD to operate in non-avalanche multiplication.

The same operation as the operation performed in first vertical scanning period VSCAN 1 is performed in third vertical scanning period VSCAN 3, and the same operation as the operation performed in second vertical scanning period VSCAN 2 is performed in fourth vertical scanning period VSCAN 4. Subsequently, control may be carried out by switching voltage VA with a desired timing according to a scene as described later. Since one vertical scanning period is required for an exposure time, and another one vertical scanning period is required for readout, pixel signals are output during only one vertical scanning period out of the two vertical scanning periods.

Next, a reset operation at the time of starting exposure and a readout operation after an end of the exposure will be described with reference to FIG. 6A and FIG. 6B.

Figure 6A:
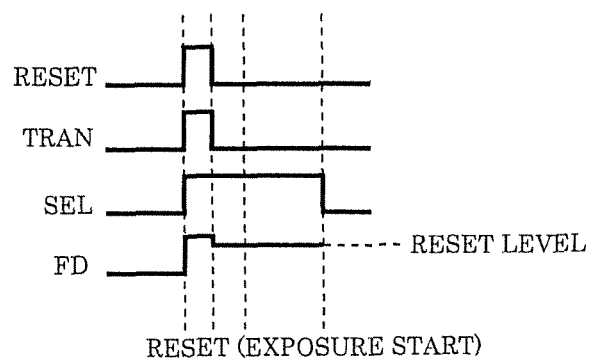
FIG. 6A is a driving timing chart at the time of starting exposure of a pixel circuit according to Embodiment 1.

FIG. 6A illustrates a driving example of outputting a reset state of a pixel signal to vertical signal line SIGNAL. The FD is initialized as a result of reset transistor MRES being turned on. Here, transfer transistor MTG is also turned on while reset transistor MRES is in the on state, thereby making it possible to also initialize (deplete) avalanche photodiode APD.

Figure 6B:
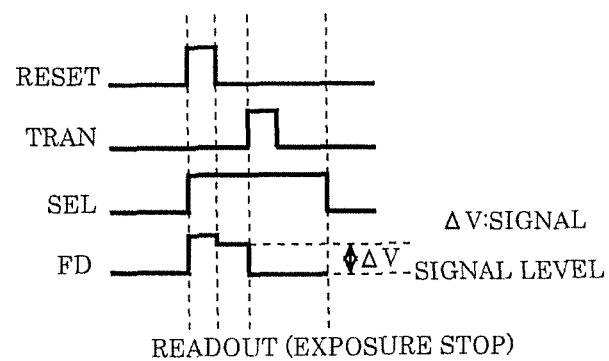
FIG. 6B is a driving timing chart at the time of ending exposure according to Embodiment 1.

FIG. 6B illustrates a driving example of outputting an accumulated electric charge signal of a pixel signal to vertical signal line SIGNAL. The potential of the FD is initialized as a result of reset transistor MRES being turned on. Subsequently, transfer transistor MTG is turned on while reset transistor MRES is in the off state, and thereby the signal charges accumulated in avalanche photodiode APD are transferred to the FD.

Correlated double sampling circuit 105 detects difference ΔV between a reset level indicated in FIG. 6A and a signal level indicated in FIG. 6B. Horizontal scanning circuit 106 transfers the signal which is denoised, to output amplifier 107 in column order. Output amplifier 107 outputs the signal to the outside.

Figure 7:
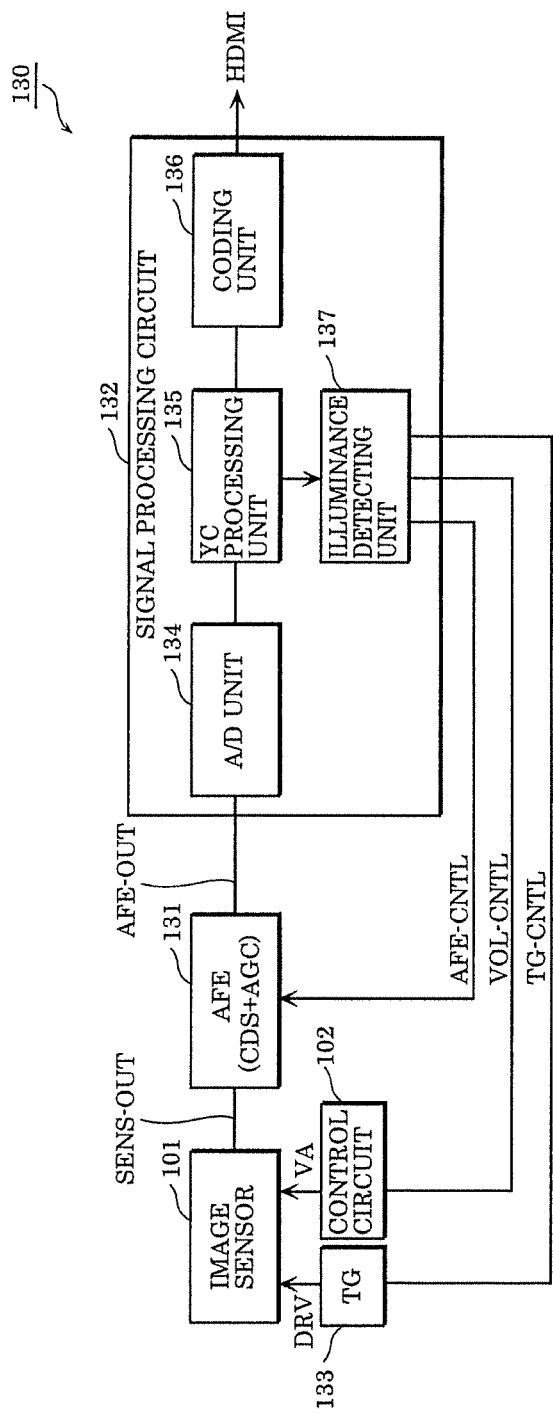
FIG. 7 is a schematic diagram of a camera system which includes the imaging apparatus according to Embodiment 1.

The following provides explanation as to whether voltage VA which is applied to avalanche photodiode APD is set to voltage VAPD for causing avalanche photodiode APD to operate in the avalanche multiplication or to voltage VPD for causing avalanche photodiode APD to operate in the non-avalanche multiplication, with reference to an example of camera system 130 illustrated in FIG. 7.

Camera system 130 includes image sensor 101, control circuit 102, analogue front end (AFE) 131, signal processing circuit 132, and timing generator (TG) 133.

Image sensor 101 outputs pixel signal SENS-OUT to analogue front end 131. Analogue front end 131 includes a CDS circuit and a gain control amplifier circuit (AGC), and outputs signal AFE-OUT which is a signal resulting from multiplying a signal component detected from pixel signal SENS-OUT by a gain. Signal processing circuit 132 is, for example, a signal processing LSI, and includes A/D unit 134, Y/C processing unit 135, coding unit 136, and illuminance detecting unit 137. A/D unit 134 converts signal AFE-OUT that is an analogue signal into a digital signal. Y/C processing unit 135 performs Y/C processing on the digital signal obtained by A/D unit 134. Coding unit 136 codes the signal obtained by Y/C processing unit 135, thereby generating signal HDMI. Illuminance detecting unit 137 detects illuminance using the signal obtained by Y/C processing unit 135.

More specifically, signal processing circuit 132 compares a luminance level of signal AFE-OUT with a threshold level that is set in advance to signal processing circuit 132, thereby determining whether image capturing is performed at low illuminance or at high illuminance. When signal processing circuit 132 determines that the image capturing is performed at low illuminance, signal processing circuit 132 outputs, during the blanking period, control signal for power supply switching circuit VOL-CNTL which instructs switching of voltage VA to voltage VAPD for causing avalanche photodiode APD to operate in the avalanche multiplication mode. When signal processing circuit 132 determines that the image capturing is performed at high illuminance, signal processing circuit 132 outputs, during the blanking period, control signal for power supply switching circuit VOL-CNTL which instructs switching of voltage VA to voltage VPD for causing avalanche photodiode APD to operate in the non-avalanche multiplication mode.

Figure 8A:
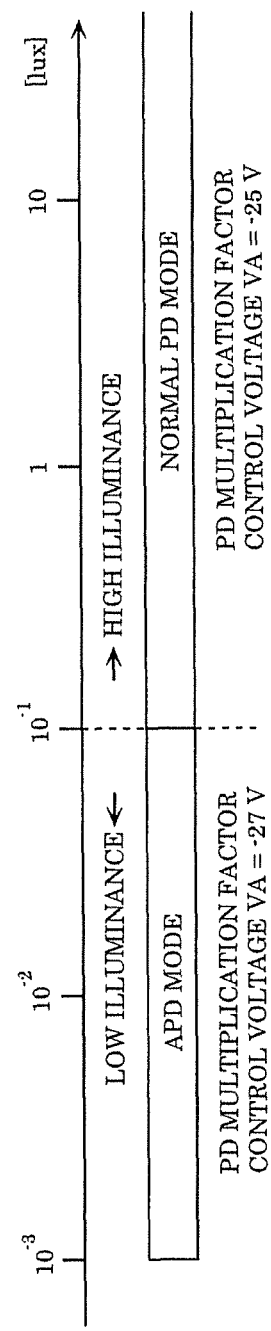
FIG. 8A is a schematic diagram which illustrates the number of incident photons and an example of changing of image capturing modes.
Figure 8B:
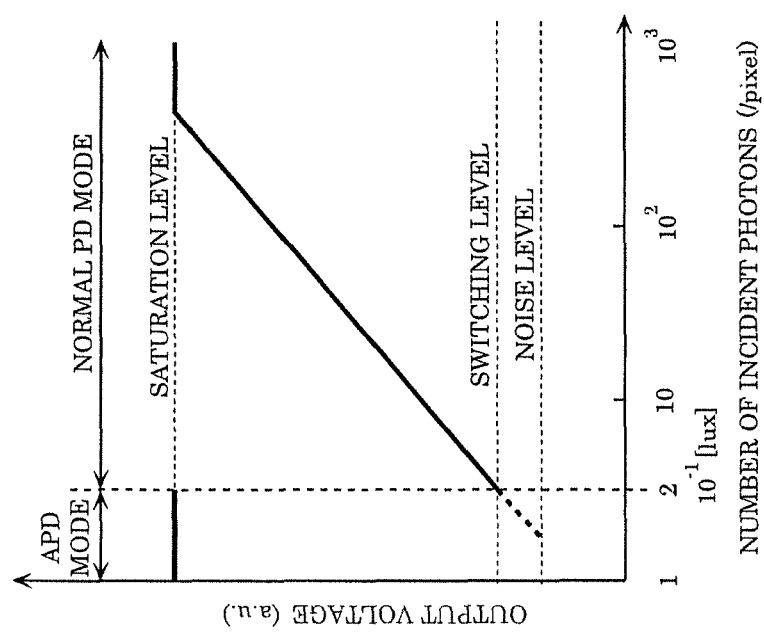
FIG. 8B is a schematic diagram which illustrates the number of incident photons and an example of changing of image capturing modes.

As one example, in the case where a luminance level when two photons are incident per one pixel is defined as 0.1 Lux as illustrated in FIG. 8A and FIG. 8B, voltage VA which is applied to avalanche photodiode APD is set to voltage VAPD for causing avalanche photodiode APD to operate in the avalanche multiplication, when an output voltage of pixel signal SENS-OUT is lower than a voltage of a switching level. On the other hand, when an output voltage of pixel signal SENS-OUT is higher than a voltage of the switching level, control circuit 102 applies voltage VPD for causing avalanche photodiode APD to operate in the non-avalanche multiplication mode to avalanche photodiode APD.

It should be noted that the operation mode may be determined on the basis of incident light illuminance of light incident on image sensor 101 or the number of photons, instead of determining the operation mode on the basis of an output voltage of pixel signal SENS-OUT. In this case, for example, a device which detects the incident light illuminance or the number of photons is separately provided, and signal processing circuit 132 outputs control signal for power supply switching circuit VOL-CNT, based on the result of detection by the device.

Figure 9:
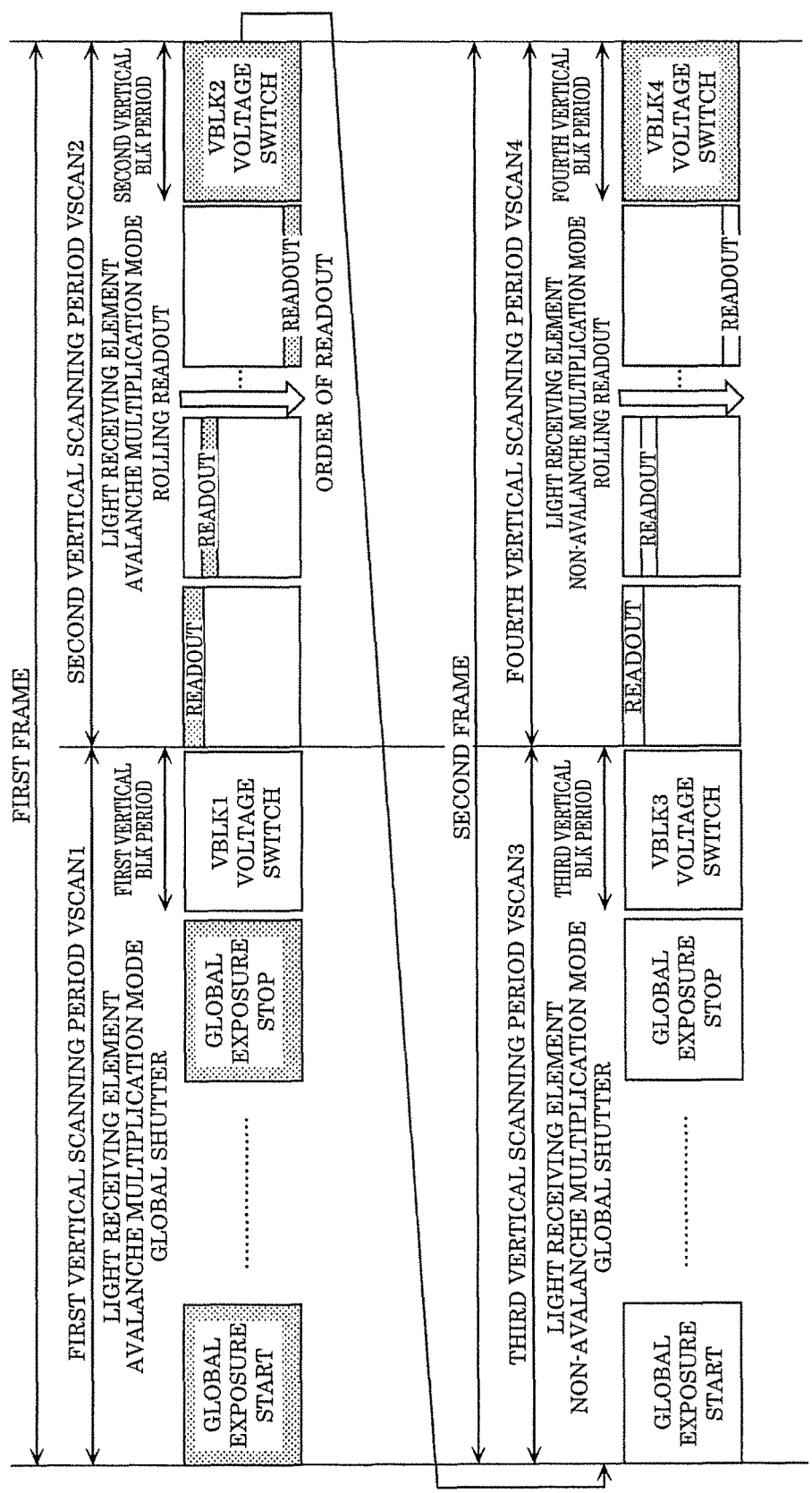
FIG. 9 is a schematic diagram related to an example of driving the imaging apparatus according to Embodiment 1.

As another exposure method, global exposure may be performed as illustrated in FIG. 9. The following describes an operation sequence in which voltages of all of the pixels are switched and global driving is concurrently performed on all of the pixels is adopted, with reference to FIG. 9. In this case as well, the power supply cannot be switched until signals of all of the pixels are output after the exposure, and thus two vertical scanning periods correspond to one frame.

First, in first vertical scanning period VSCAN1, a signal is output to all of the pixels from vertical scanning circuit 104, thereby causing the pixels to start to be exposed. Then, after the exposure of each of the pixels ends, first vertical blanking period BLK1 starts.

Next, in the second vertical scanning period VSCAN2, a signal output from vertical scanning circuit 104 causes electric charges accumulated in the pixels to be read by the source follower circuit in the order of the nth row, the n+1th row, and the n+2th row. When the readout of each of the pixels is completed, second vertical blanking period BLK2 starts.

At this time, in second vertical blanking period BLK 2, control circuit 102 switches voltage VA which is applied to avalanche photodiode APD, to voltage VAPD for causing avalanche photodiode APD to operate in the avalanche multiplication or voltage VPD for causing avalanche photodiode APD to operate in the non-avalanche multiplication.

The same operation as the operation performed in first vertical scanning period VSCAN 1 is performed in third vertical scanning period VSCAN 3, and the same operation as the operation performed in second vertical scanning period VSCAN 2 is performed in fourth vertical scanning period VSCAN 4. Subsequently, control may be carried out by switching voltage VA with a desired timing according to a scene as described below. Since one vertical scanning period is required for the exposure time, and another vertical scanning period is further required for readout, pixel signals are output during only one vertical scanning period out of the two vertical scanning periods. Compared to the rolling exposure, simultaneity of an object is maintained by performing global exposure, that is, by concurrently performing exposure on all of the pixels. In this manner, it is possible to eliminate distortion of an object when capturing an image of an object moving at high speed.

Figure 10:
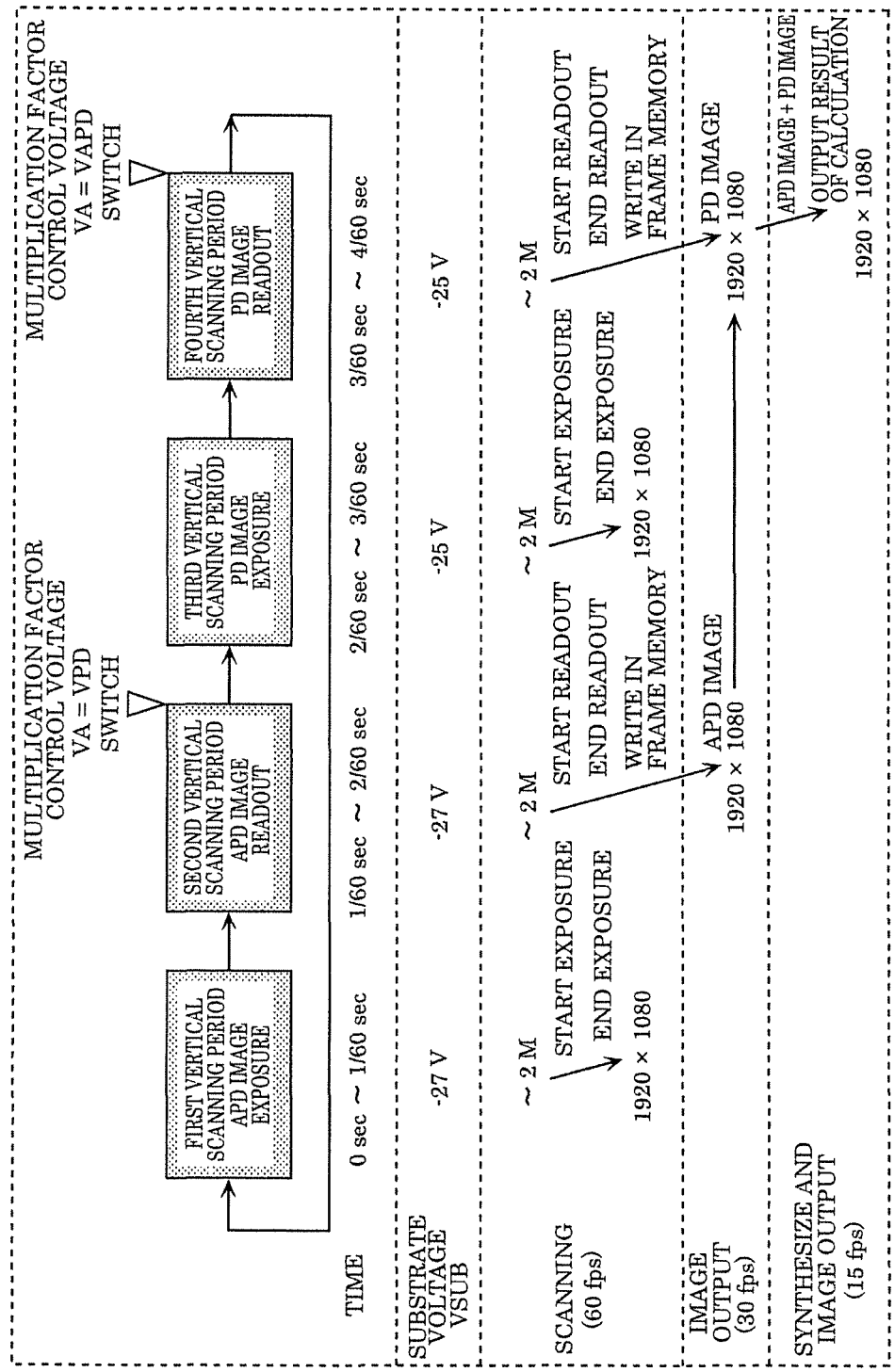
FIG. 10 is a schematic diagram which illustrates a sequence example of operations ending with image output performed by the imaging apparatus according to Embodiment 1.

In the present embodiment, an image in the avalanche multiplication mode and an image in the non-avalanche multiplication mode are alternately output in one vertical scanning period out of the two vertical scanning periods. FIG. 10 is a diagram which illustrates a sequence example when voltages of all of the pixels are switched to perform the rolling exposure or the global exposure. When the one vertical scanning period of imaging apparatus 100 is 1/60 seconds, an image in the avalanche multiplication mode is output by an operation in 1/30 seconds, and an image in the non-avalanche multiplication mode is output by an operation in 1/30 seconds. When images of the respective modes are alternately output, although there is a possibility that an output image is recognized as a wide dynamic range image according to dynamic vision of human eyes, since the images are different images as still images, each of the images is not a wide dynamic range image individually.

In view of the above, according to the present embodiment, an image in the avalanche multiplication mode and an image in the non-avalanche multiplication mode are combined in a frame memory to generate one image, and the generated image is output at intervals of 1/15 seconds. In this case, image capturing is performed in a period of time that is four times longer than 1/60 seconds that is the one vertical scanning period of imaging apparatus 100, but it is possible to output a wide dynamic range image.

Variation of Embodiment 1

Figure 11:
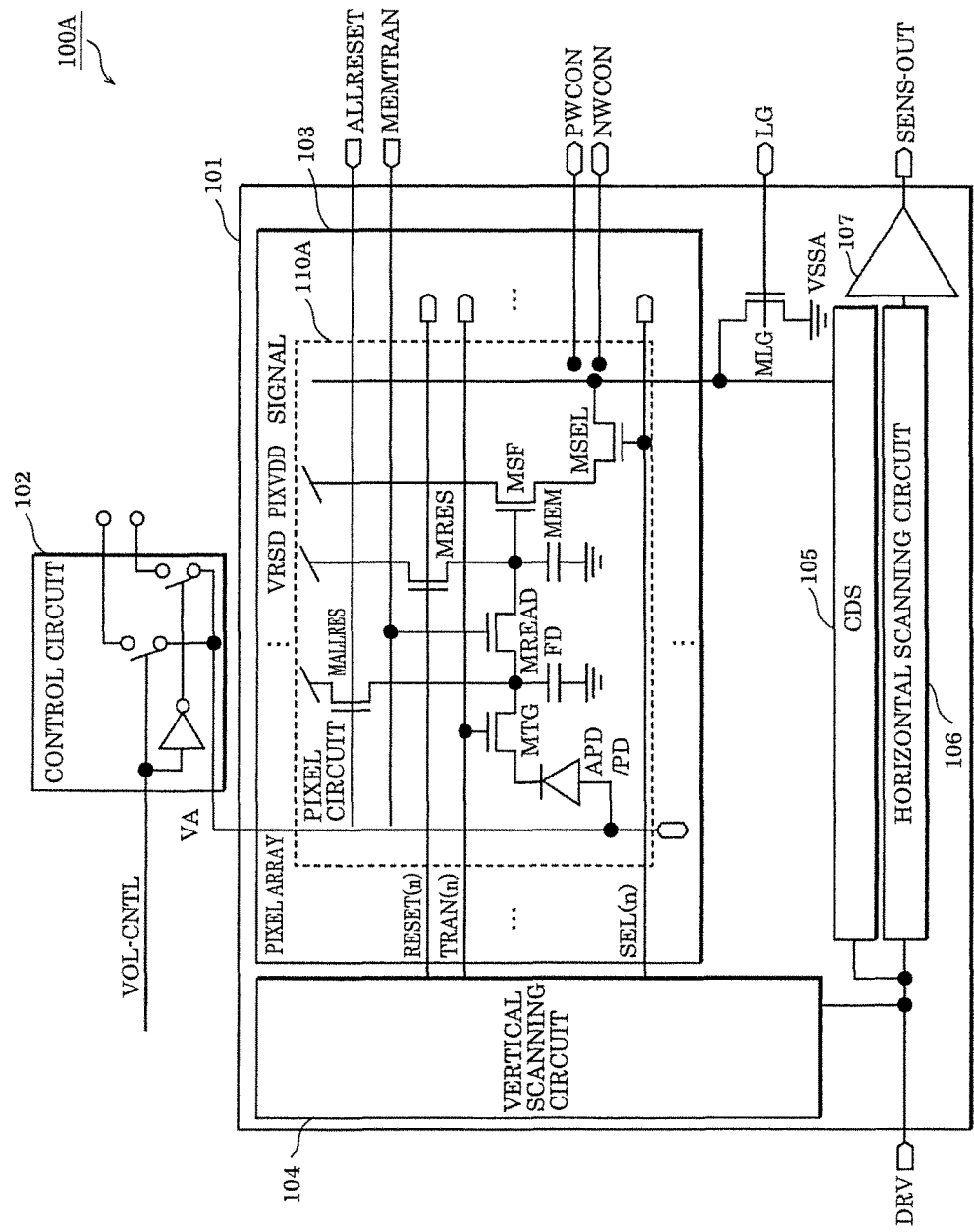
FIG. 11 is a circuit block diagram of an imaging apparatus according to Variation of Embodiment 1.

In the global exposure, it is possible to reduce the length of an image capturing period when performing image capturing by switching between the avalanche multiplication mode and the non-avalanche multiplication mode, by providing memory element MEM as indicated in pixel circuit 110A as illustrated in FIG. 11.

FIG. 11 is a circuit diagram of imaging apparatus 100A according to the present variation. In the circuit diagram illustrated in FIG. 11, an all-reset signal for resetting FDs of all of the pixels, all-reset transistor MALLRES, a MEMTRAN signal for transferring a signal from an FD to memory element MEM, and read transistor MREAD are provided in addition to memory element MEM.

Figure 12:
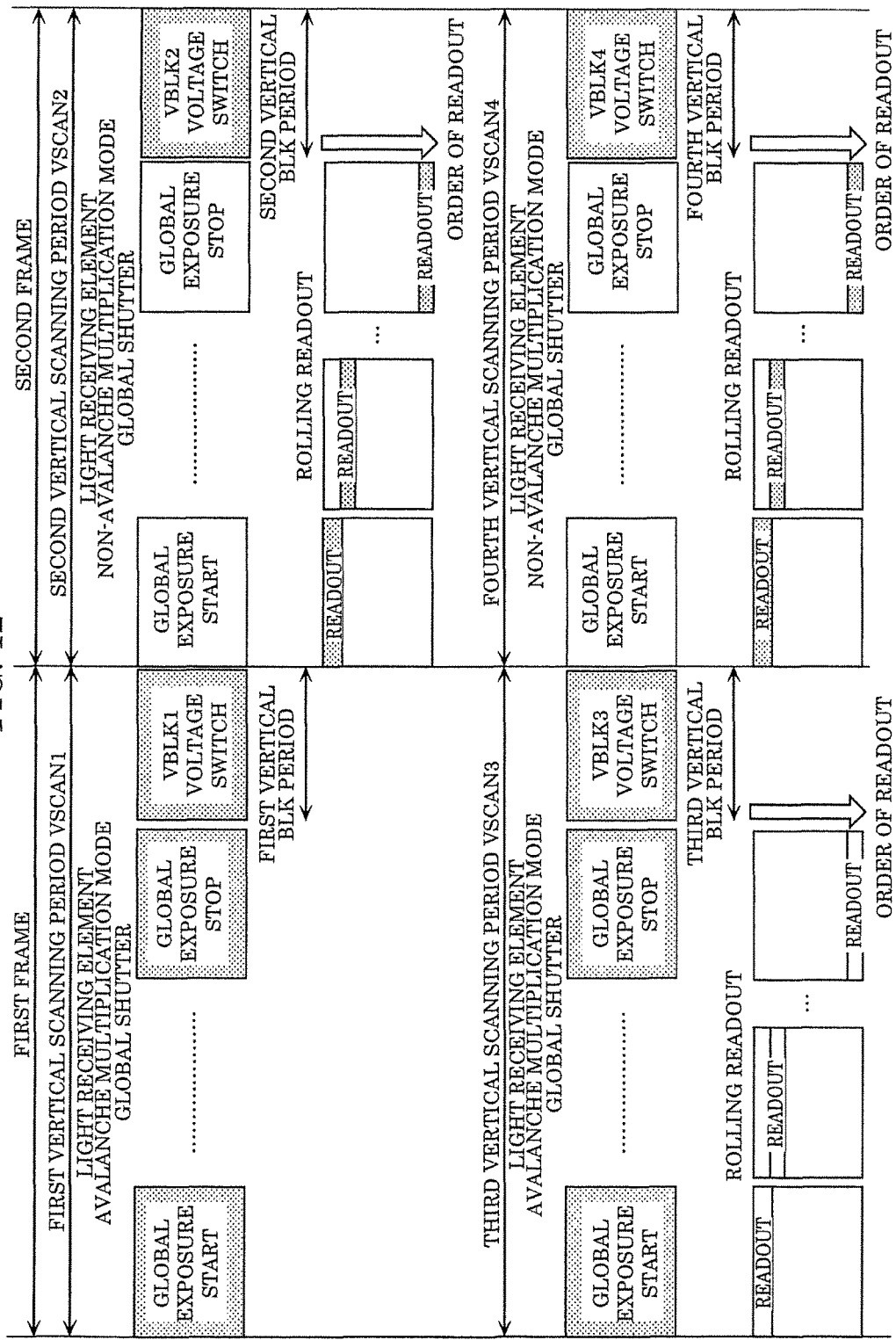
FIG. 12 is a schematic diagram related to an example of driving the imaging apparatus according to Variation of Embodiment 1.

FIG. 12 is a diagram which illustrates a driving example when voltages of all of the pixels are switched to perform global exposure. It is possible to completely separate the exposure operation from the readout operation of reading from the memory, by including memory element MEM in a pixel. Accordingly, it is possible to perform exposure in a mode different from the exposure mode of a previous vertical scanning period concurrently with readout of an image exposed in the previous vertical scanning period, as illustrated in FIG. 12. For example, in second vertical scanning period VSCAN2, an image exposed in the avalanche multiplication mode is read, while the image is exposed in the non-avalanche multiplication mode. In third vertical scanning period VSCAN3, an image exposed in the non-avalanche multiplication mode is read, while the image is exposed in the avalanche multiplication mode.

Figure 13A:
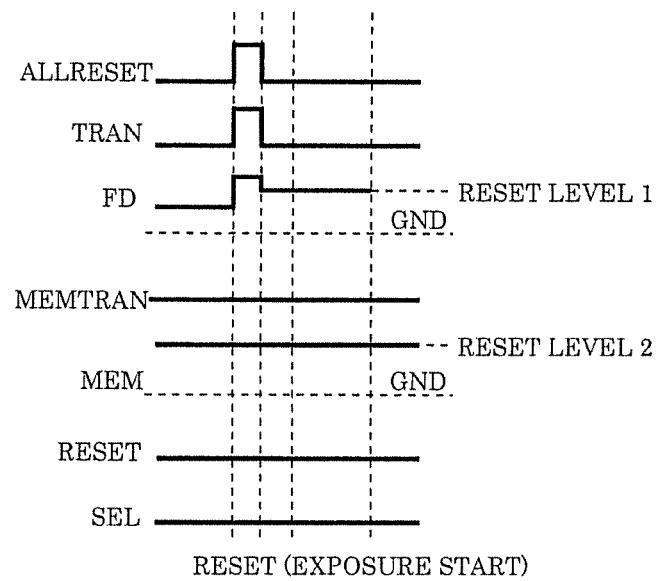
FIG. 13A is a driving timing chart at the time of starting exposure of a pixel circuit according to Variation of Embodiment 1.

FIG. 13A illustrates a driving example of resetting pixel signals accumulated in an FD and avalanche photodiode APD. The all-reset transistor is turned on to initialize the FD, and transfer transistors MTG of all of the pixels are also turned on while the all-reset transistor is in an on state, thereby making it possible to also initialize (deplete) avalanche photodiode APD. Subsequently, exposure is started, and photoelectric conversion is started in avalanche photodiode APD.

Figure 13B:
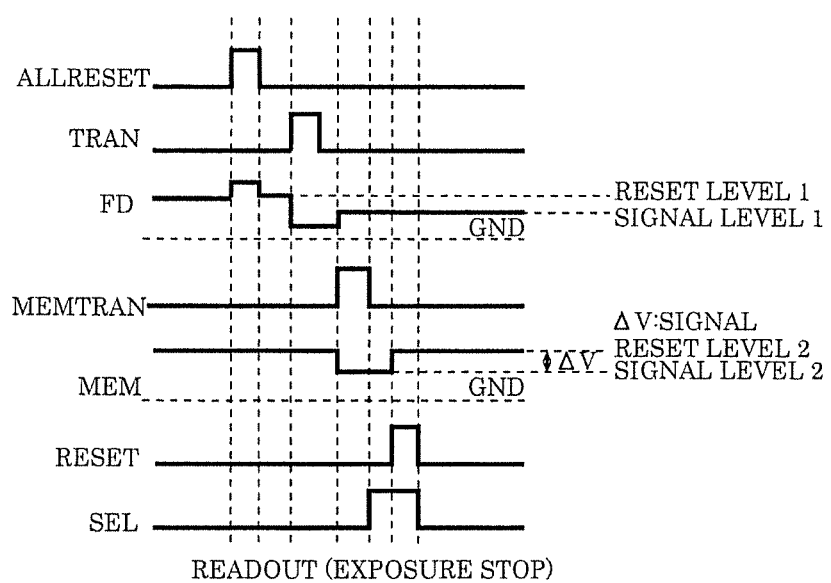
FIG. 13B is a driving timing chart at the time of ending exposure according to Variation of Embodiment 1.

FIG. 13B illustrates a driving example of reading pixel signals accumulated in avalanche photodiode APD. All-reset transistor MALLRES is turned on, and FDs of all of the pixels are initialized. Subsequently, transfer transistor MTG of each of the pixels is turned on, and a pixel signal is transferred to the FD. Next, read transistor MREAD of each of the pixels is turned on, and the pixel signal is transferred to memory element MEM. Then, vertical scanning circuit 104 outputs reset signal RESET for controlling reset transistor MRES and row select signal SEL for controlling row selecting transistor MSEL, in the order of the nth row, the n+1th row, and the n+2th row.

Correlated double sampling circuit 105 detects difference ΔV between a voltage output to vertical signal line SIGNAL immediately after row selecting signal SEL is turned on and a voltage output when memory element MEM is initialized by reset transistor MRES is subsequently turned on, thereby obtaining a signal component. Horizontal scanning circuit 106 transfers an obtained signal to output amplifier 107 in column order, and output amplifier 107 outputs the transferred signal to the outside.

Figure 14:
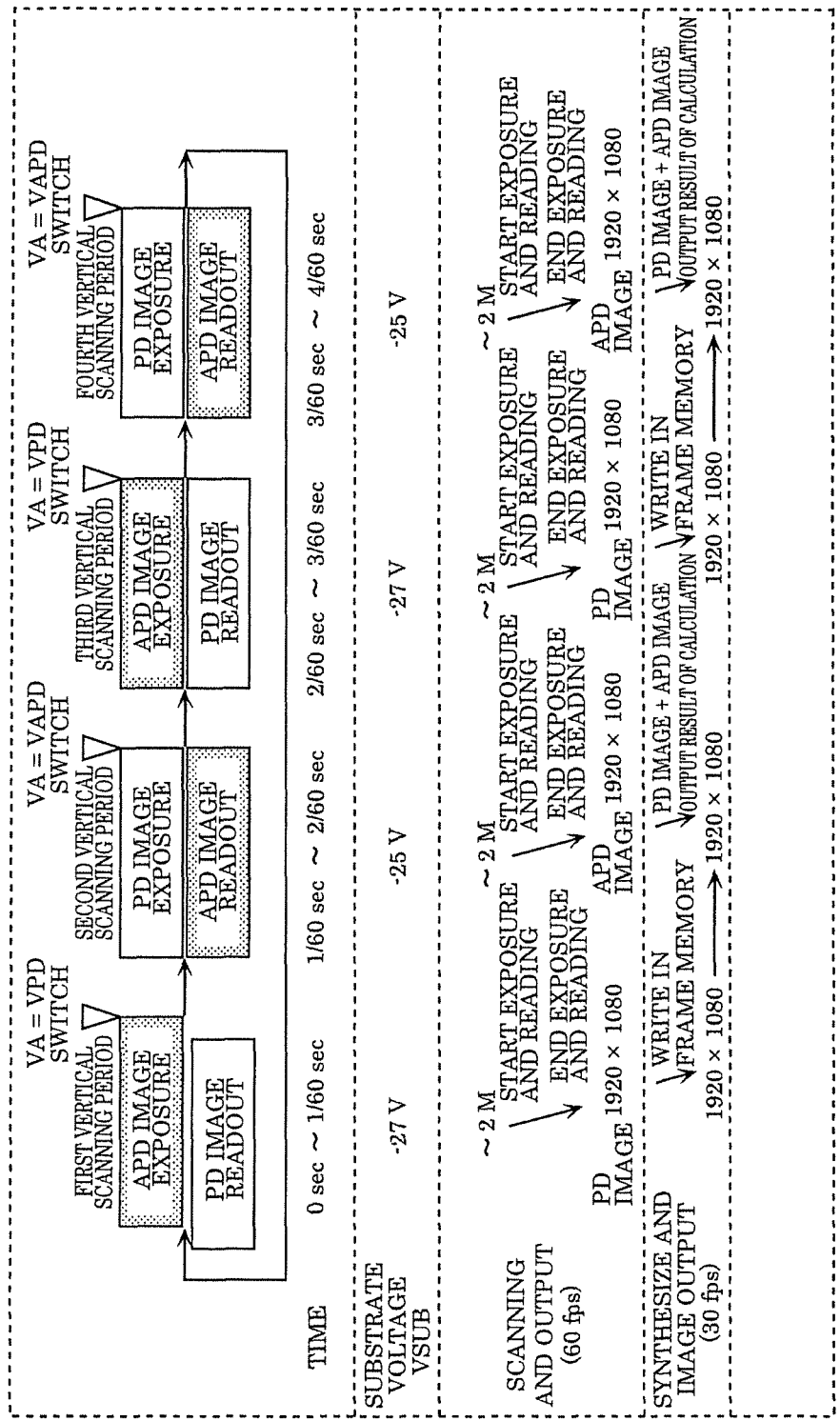
FIG. 14 is a schematic diagram which illustrates a sequence example of operations ending with image output performed by the imaging apparatus according to Variation of Embodiment 1.

FIG. 14 is a diagram which illustrates a sequence example when voltages of all of the pixels are switched to perform global exposure. According to the driving illustrated in FIG. 14, it is possible to output one image in one vertical scanning period. Accordingly, it is possible to improve a frame rate of video to be twice as high as the frame rate of the previous rolling driving.

Embodiment 2

It is also possible to switch between the avalanche multiplication mode and the non-avalanche multiplication mode, by fixing voltage VA which is applied to avalanche photodiode APD to voltage VPD for causing avalanche photodiode APD to operate in the non-avalanche multiplication, and changing an under-pixel well potential to switch voltages which are applied to both ends of avalanche photodiode APD. This utilizes the fact that, when a well potential is changed, a voltage on the cathode of avalanche photodiode APD also changes according to the change in the well potential. When a potential difference between the cathode side and the anode side of avalanche photodiode APD exceeds breakdown voltage VB, it is possible to shift avalanche photodiode APD to be in the avalanche multiplication mode.

Figure 15:
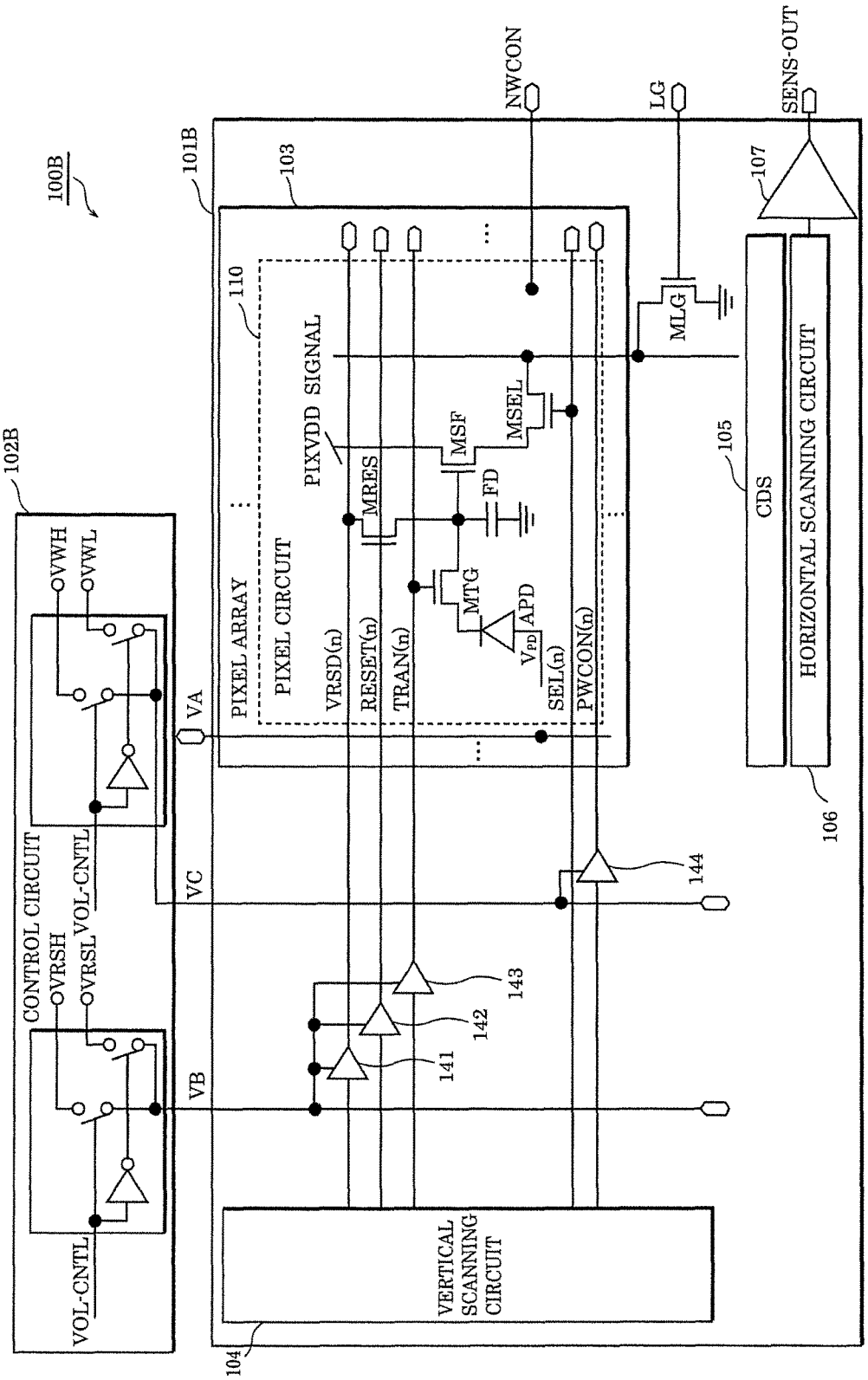
FIG. 15 is a circuit block diagram of an imaging apparatus according to Embodiment 2.
Figure 16:
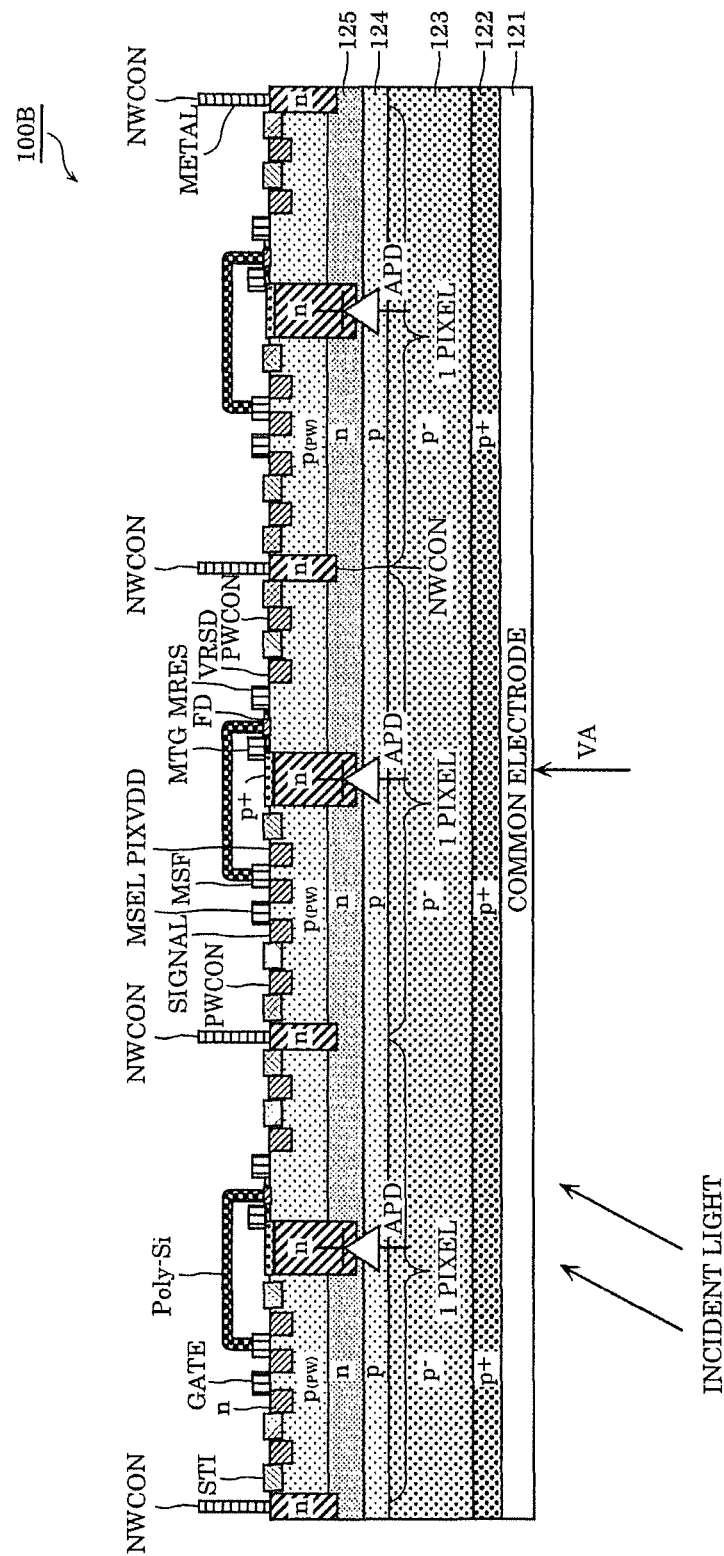
FIG. 16 is a cross-sectional diagram of the imaging apparatus according to Embodiment 2.

FIG. 15 is a circuit diagram of imaging apparatus 100B according to the present embodiment. FIG. 16 is a cross-sectional diagram of imaging apparatus 100B according to the present embodiment. The following describes an operation of imaging apparatus 100B according to the present embodiment, with reference to these diagrams. A main difference between the present embodiment and Embodiment 1 is that control circuit 102B changes each of voltage VB that is supplied as reset drain voltage VRSD and voltage VC that is supplied as well voltage PWCON.

Control circuit 102B supplies voltage VRSH to voltage VB and supplies voltage VWH to voltage VC in the case where avalanche photodiode APD is caused to operate in the avalanche multiplication mode, and supplies voltage VRSL to voltage VB and supplies voltage VWL to voltage VC in the case where avalanche photodiode APD is caused to operate in the non-avalanche multiplication mode. It should be noted that, in the present embodiment, under the assumption that the voltage difference is 2V, voltage VRSH is set to 5V, voltage VRSL is set to 3V, voltage VWH is set to 2V, and voltage VWL is set to 0V, as illustrated in FIG. 17. In addition, in order to independently change a voltage for each of the rows by row scanning, buffer circuits 141 to 144 each having a high driving ability are inserted as souses of supplying each of the voltages in image sensor 101B.

In the case where avalanche photodiode APD is caused to operate in the avalanche multiplication mode, control circuit 102B supplies voltage VWH to a power supply of buffer circuit 144 which is a drive circuit, so as to set well voltage PWCON to voltage VWH. In addition, reset drain potential VRSD is set to voltage VRSH. Pulse heights at ON time of reset signal RESET and transfer signal TRAN which are pulse signals at this time become equivalent to voltage VRSH as a result of voltage VRSH being supplied to a power supply of each of buffer circuit 142 and buffer circuit 143. Likewise, a pulse height at ON time of reset drain voltage VRSD becomes equivalent to voltage VRSH as a result of voltage VRSH being supplied to a power supply of buffer circuit 141. Voltage VWH is applied to the cathode of avalanche photodiode APD, and a voltage on the anode side that is one of terminals is fixed to voltage VPD. According to the above-described configuration, the potential difference exceeds breakdown and corresponds to voltage VAPD, and thus the operation shifts to the avalanche operation mode.

In the case where avalanche photodiode APD is caused to operate in the non-avalanche multiplication mode, control circuit 102B sets well voltage PWCON to voltage VWL, as well as setting reset drain voltage VRSD to voltage VRSL. Pulse heights at ON time of reset signal RESET and transfer signal TRAN which are pulse signals at this time become equivalent to voltage VRSL as a result of voltage VRSL being supplied to a power supply of each of buffer circuit 142 and buffer circuit 143. Likewise, a pulse height at ON time of reset drain voltage VRSD becomes equivalent to voltage VRSL as a result of voltage VRSL being supplied to a power supply of buffer circuit 141. In addition, a pulse height at ON time of well voltage PWCON also becomes equivalent to voltage VWL as a result of voltage VWL being supplied to a power supply of buffer circuit 144. Furthermore, normal voltage VRSL is applied to the cathode of avalanche photodiode APD. Meanwhile, the terminal on the anode side is fixed to voltage VPD, and the potential difference corresponds to voltage VPD, and thus the operation shifts to the non-avalanche operation mode.

Figure 18:
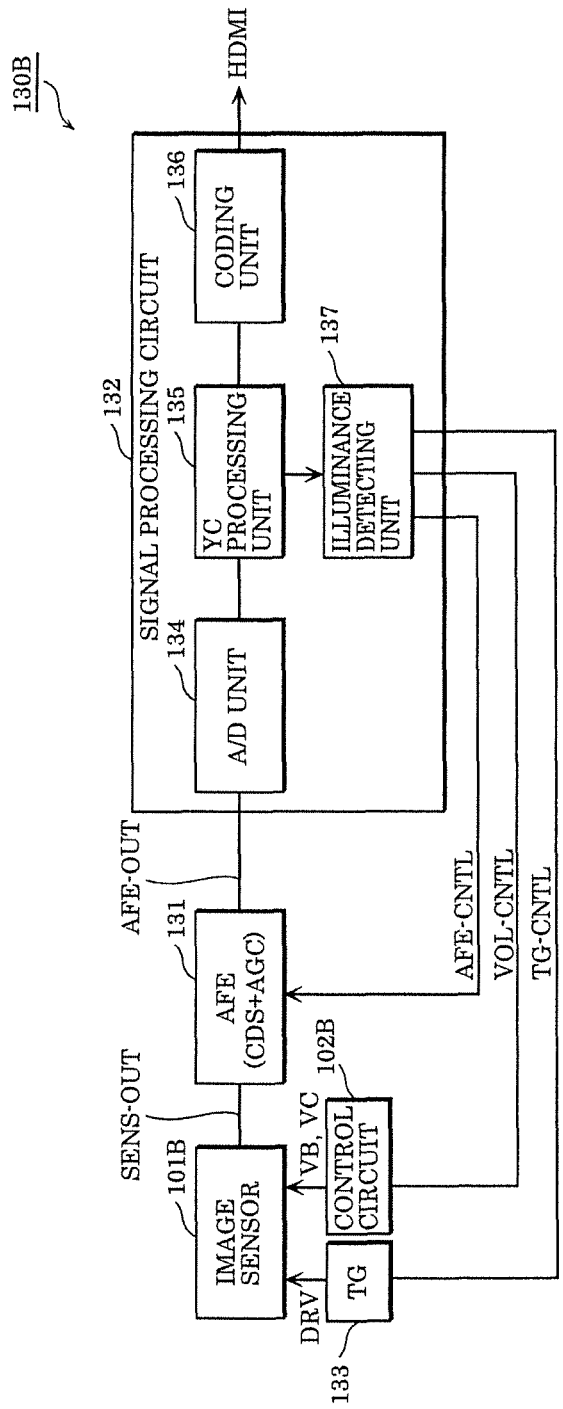
FIG. 18 is a schematic diagram of a camera system which includes the imaging apparatus according to Embodiment 2.

FIG. 18 is a diagram which illustrates an example of camera system 130B which switches between the avalanche operation mode and the non-avalanche operation mode. Analogue front end 131 generates signal AFE-OUT by multiplying, by a gain, a signal component detected from pixel signal SENS-OUT output from image sensor 101B. Signal processing circuit 132 compares a luminance level of signal AFE-OUT with a threshold level that is set in advance to signal processing circuit 132, thereby determining whether image capturing is performed at low illuminance or at high illuminance. When signal processing circuit 132 determines that image capturing is performed at low illuminance, signal processing circuit 132 outputs control signal for power supply switching circuit VOL-CNTL which provides instruction for supplying voltage VRSH for operation in the avalanche multiplication to voltage VB and supplying voltage VWH to voltage VC.

Figure 19:
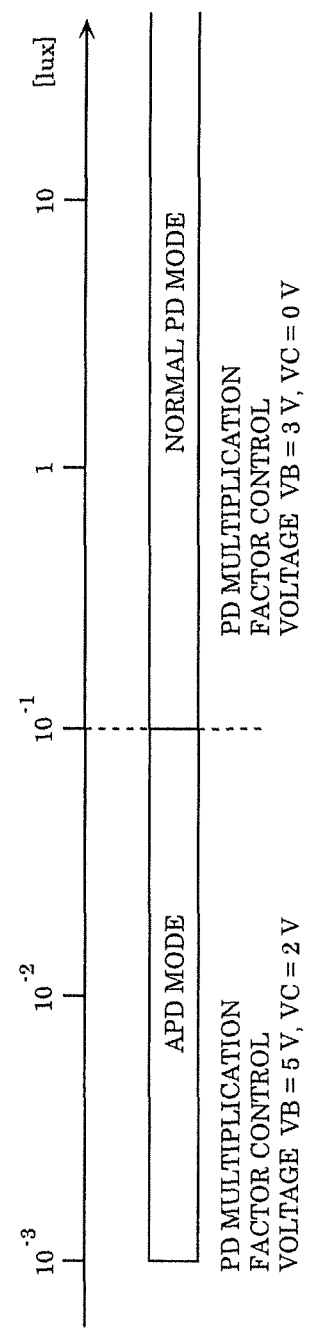
FIG. 19 is a schematic diagram related to illuminance of an object.

As one example, in the case where a boundary between low illuminance and high illuminance is defined as 0.1 Lux as illustrated in FIG. 19, voltage VRSH for the avalanche multiplication mode is supplied to voltage VB and voltage VWH is supplied to voltage VC when illuminance of incident light is lower than 0.1 Lux. When illuminance of incident light is higher than 0.1 Lux, voltage VRSL for operation in the non-avalanche multiplication mode is supplied to voltage VB, and voltage VWL is supplied to voltage VC.

Figure 20:
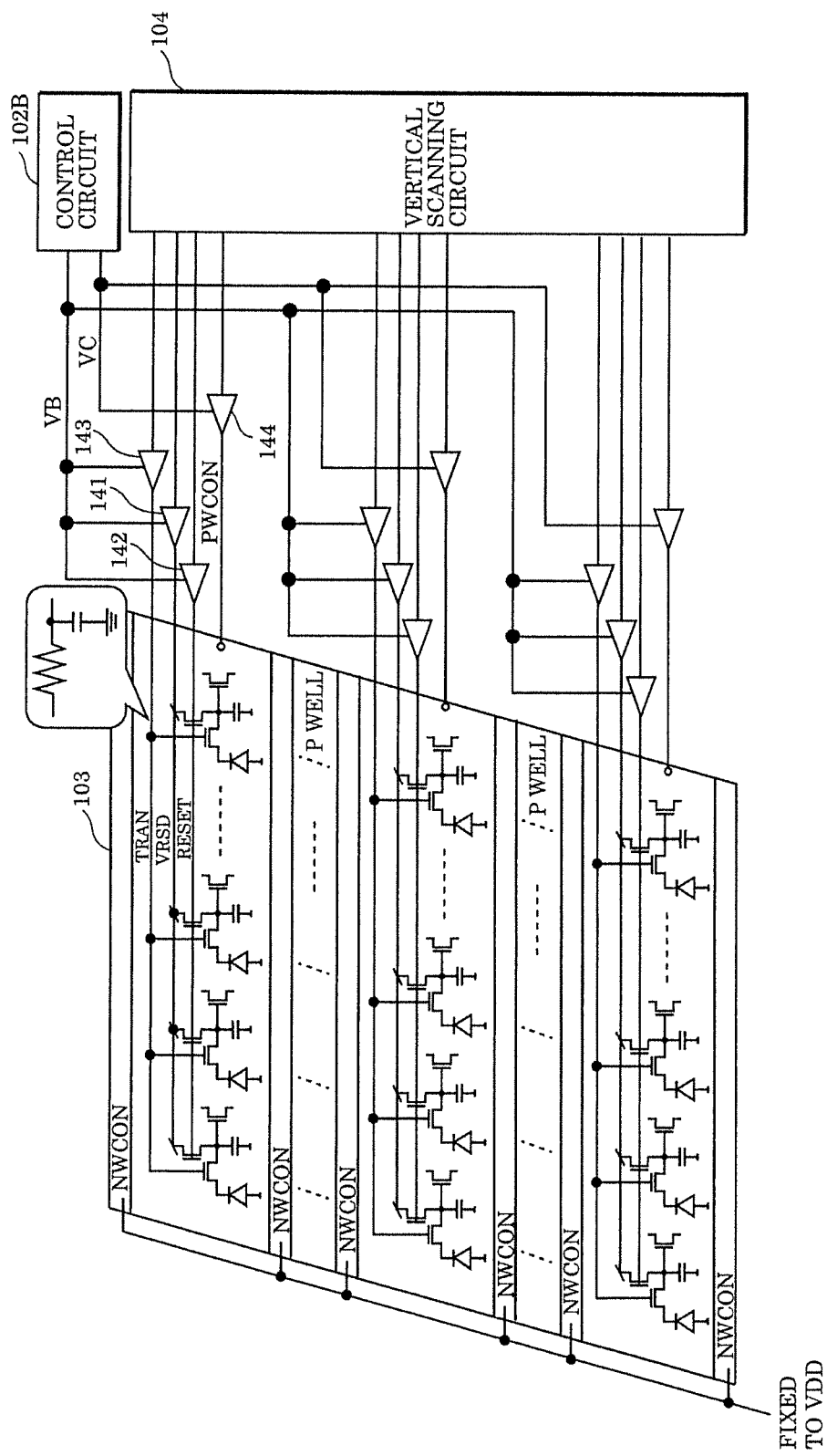
FIG. 20 is a schematic diagram which illustrates an example of changing an image capturing mode on a row basis performed by the imaging apparatus according to Embodiment 2.

FIG. 20 is a schematic diagram for explaining the case where a voltage is switched for each row and rolling driving is performed. A driving ability is necessary for supplying common voltage VB and voltage VC to each pixel row.

As illustrated in FIG. 20, according to the present embodiment, reset drain voltage VRSD, reset signal RESET, and transfer signal TRAN are shared by the pixels disposed in the row direction, and well voltage PWCON is also shared by the pixels disposed in the row direction, among the pixels which are included in pixel array 103 and arranged two dimensionally. Since parasitic capacitance C and wiring resistance R are present in a line disposed in the row direction, signal propagation delays according to the time constant. For that reason, delay is inhibited by providing buffer circuits 141 to 144 for the respective rows. This configuration makes it possible to output an image at higher speed than Embodiment 1.

Figure 21:
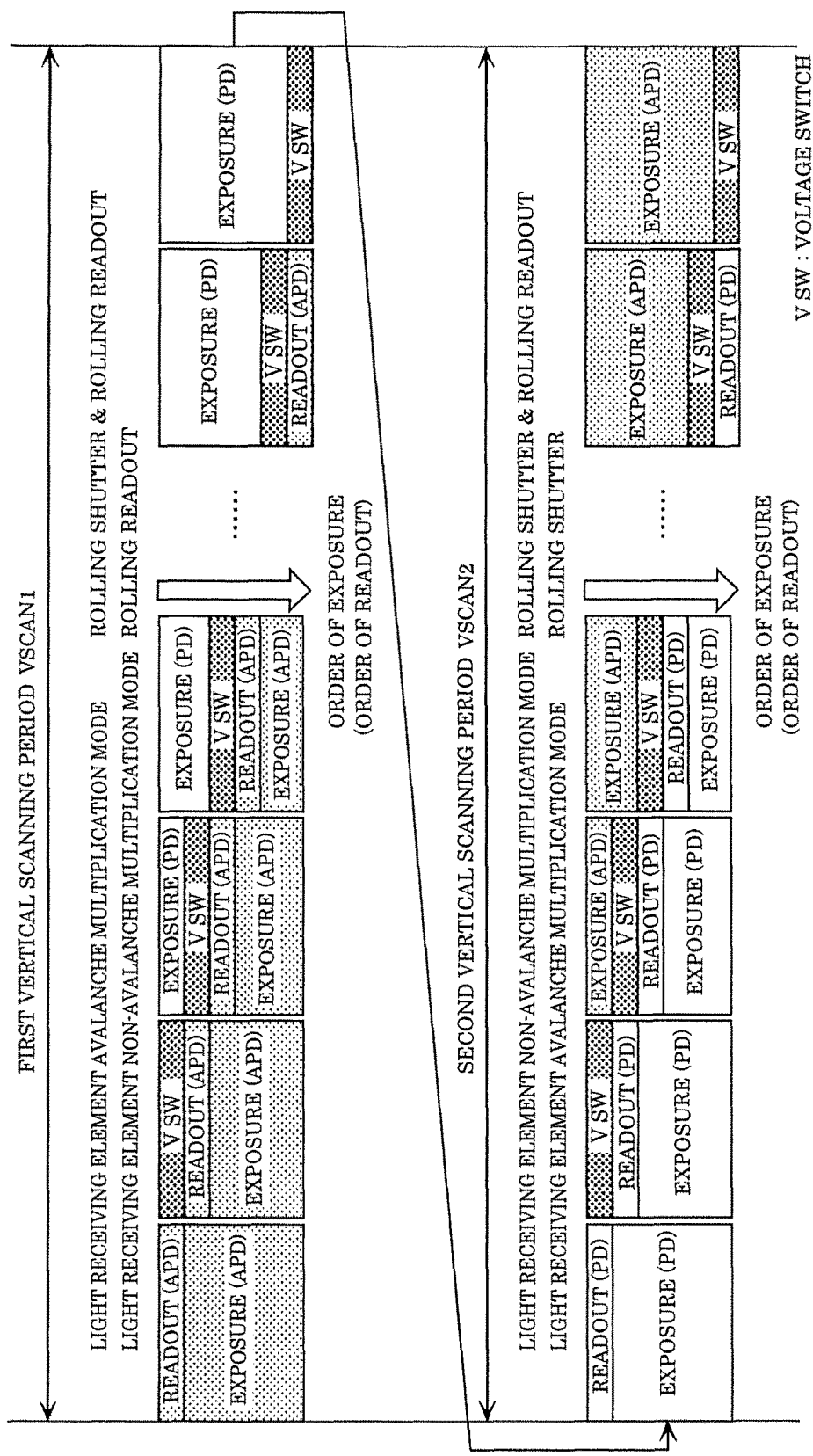
FIG. 21 is a schematic diagram related to an example of driving the imaging apparatus according to Embodiment 2.

FIG. 21 is a diagram which illustrates a driving example in the case where a voltage is switched for each row and rolling driving is performed. As illustrated in FIG. 21, a start and an end of an exposure time of avalanche photodiode APD is determined by sequential scanning for each row. After the end of the exposure time, signals of avalanche photodiode APD are read by sequential scanning for each row. Immediately after the end of the readout time, control circuit 102B is capable of changing a multiplication factor for each row. It should be noted that FIG. 21 illustrates processes in the middle of an operation.

In the non-avalanche operation mode, exposure starts in first vertical scanning period VSCAN 1, and readout starts in second vertical scanning period VSCAN 2. In the avalanche operation mode, exposure starts in second vertical scanning period VSCAN 2, and readout starts in first vertical scanning period VSCAN 1. Accordingly, unlike Embodiment 1, it is not necessary that one vertical scanning period is required for exposure time, and another one vertical scanning period is required for readout. As described above, since it is possible to change the power supply immediately after a signal is output for each row, it is possible to maintain the frame rate as one vertical scanning period.

Figure 22:
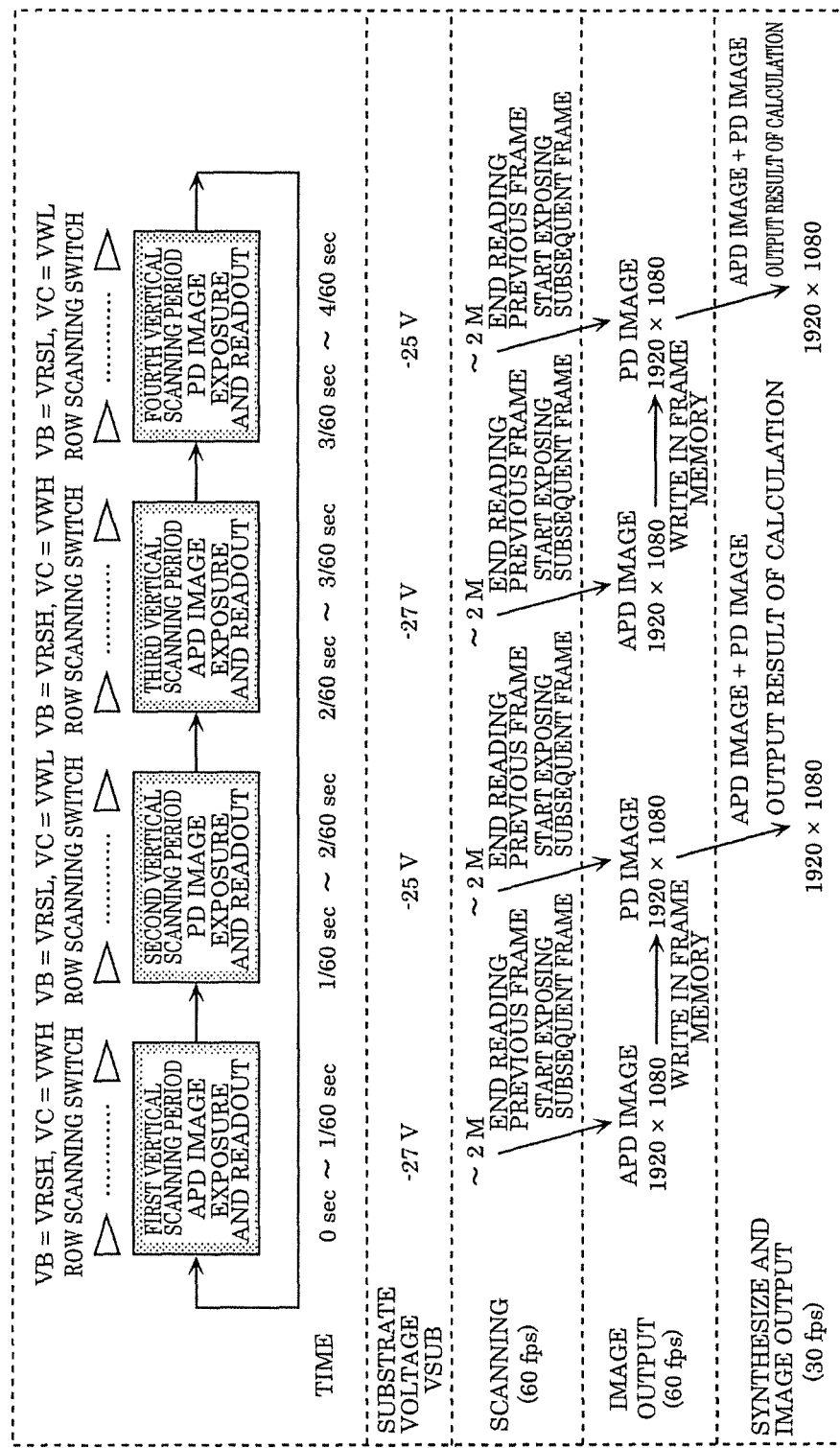
FIG. 22 is a schematic diagram which illustrates a sequence example of operations ending with image output performed by the imaging apparatus according to Embodiment 2.

In the present embodiment, an image obtained in the operation according to the avalanche multiplication mode and an image obtained in the operation according to the non-avalanche multiplication mode are switched for each vertical scanning period and output alternately one by one. FIG. 22 is a diagram which illustrates a sequence example when a voltage is changed for each row to perform the rolling exposure. When the one vertical scanning period of imaging apparatus 100B is 1/60 seconds, an image in the avalanche multiplication mode is output by an operation in 1/60 seconds, and an image in the non-avalanche multiplication mode is also output by an operation in 1/60 seconds. Images in the respective modes are alternately output, and thus the images are recognized as a moving image with a wide dynamic range. In addition, in order to generate a single image by combining images of the respective modes, it is also possible to combine an image in the avalanche multiplication mode and an image in the non-avalanche multiplication mode in a frame memory, and output an obtained image in 1/30 seconds.

The imaging apparatus and the camera system according to the embodiments have been described so far. The present disclosure is, however, not limited to the above-described embodiments.

In addition, each of the processing units included in the imaging apparatus and the camera system according to the above-described embodiments is implemented typically as an LSI that is an integrated circuit. They may be realized as a single chip one-by-one, or as a single chip to include part or all of them.

Further, the integrated circuit is not limited to an LSI, and it may be embodied as a dedicated circuit or a general-purpose processor. A field programmable gate array (FPGA) which can be programmed after manufacturing an LSI, or a reconfigurable processor in which connection and configuration of circuit cells inside an LSI can be reconfigured may be used.

Furthermore, the functions of the camera system according to the above-described embodiments may partially be implemented by execution of a program by a processor such as a CPU, etc.

In addition, although a corner portion and a side of each of the structural components are lineally illustrated in the above-described cross-sectional diagrams, etc., the present disclosure also includes the structural components which have a rounded corner portion and a rounded side.

In addition, each of the numerals described above is used for exemplification to specifically describe the present disclosure, and the present disclosure is not limited by the numerals used for exemplification. In addition, the logic level represented by high/low or the switching status represented by on/off is presented as an example to specifically explain the present disclosure, and it is also possible to obtain an equivalent result with different combination of the exemplified logic level or switching status.

Furthermore, the division of the functional blocks illustrated in the block diagrams has been presented as one example. Accordingly, a plurality of functional blocks may be implemented as one functional block, or one functional block may be divided into a plurality of functional blocks or a portion of the functions may be transferred to another functional block. In addition, functions of a plurality of functional blocks having similar functions may be processed by single hardware or software in parallel or in time division.

Although the imaging apparatus according to one or more aspects have been described above based on the embodiments, the present disclosure is not limited to the above-described embodiments. Other forms in which various modifications apparent to those skilled in the art are applied to the embodiments, or forms structured by combining structural components of different embodiments may be included within the scope of one or more aspects of the present disclosure, unless such changes and modifications depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The imaging apparatus according to the present disclosure is, when used outdoors, suitable for a monitoring camera, an on-vehicle camera, etc., which require a wide dynamic range. When used indoors, the imaging apparatus according to the present disclosure is also applicable to fluorescence observation, in-plant monitoring, etc. In addition, in the medical field, use of the imaging apparatus according to the present disclosure as an endoscope makes it possible to reduce the size of the light source. Accordingly, it is possible to develop a camera whose size is further reduced. Moreover, in an X-ray camera used for digital X-ray, etc., it is possible to capture an image with a less amount of X-ray radiation, and thus it is possible to reduce the amount of X-ray exposure for a patient.

What is claimed is:

1. An imaging apparatus, comprising:
a pixel array in which a plurality of pixels are arranged in rows and columns; and
a control circuit, wherein
the pixel array includes:
an avalanche photodiode;
a charge accumulation portion which accumulates a signal charge generated in the avalanche photodiode;
a reset transistor which initializes the charge accumulation portion;
a transfer transistor which connects the avalanche photodiode and the charge accumulation portion; and
an amplification transistor which converts the signal charge into a voltage, and
the control circuit:
is connected to the avalanche photodiode; and
changes a multiplication factor of the avalanche photodiode at one of (i) a first timing subsequent to an exposure period of a first frame in a first vertical scanning period and a readout period of the first frame in a second vertical scanning period, and previous to an exposure period of a second frame in a third vertical scanning period, and (ii) a second timing subsequent to an exposure period of the first frame in the first vertical scanning period, and previous to a readout period of the first frame and an exposure period of the second frame which are provided in parallel in the second vertical scanning period.

2. The imaging apparatus according to claim 1, wherein the control circuit compares a threshold set in advance and an output value of an image sensor including the pixel array, and changes the multiplication factor according to a comparison result.

3. The imaging apparatus according to claim 1, wherein the control circuit concurrently changes the multiplication factor of each of the plurality of pixels.

4. The imaging apparatus according to claim 1, wherein when the control circuit changes the multiplication factor at the first timing, the exposure period is set for each of the rows.

5. The imaging apparatus according to claim 1, wherein when the control circuit changes the multiplication factor at the first timing, the exposure period is common among all of the pixels.

6. The imaging apparatus according to claim 1, wherein the control circuit changes the multiplication factor after every two vertical scanning periods, and outputs two images alternately one by one, after every two vertical scanning periods, the two images being generated according to the signal charges having different multiplication factors.

7. The imaging apparatus according to claim 1, wherein the control circuit changes the multiplication factor after every two vertical scanning periods, and combines two images generated according to the signal charges having different multiplication factors into one image, and outputs the one image.

8. The imaging apparatus according to claim 1, wherein when the control circuit changes the multiplication factor at the second timing, the pixel array further includes:
a memory element disposed between the charge accumulation portion and the amplification transistor; and
a read transistor disposed between the charge accumulation portion and the memory element,
the exposure period is common among all of the pixels, and
during the exposure period, the read transistor is off and a signal is read.

9. The imaging apparatus according to claim 8, wherein the control circuit changes the multiplication factor after every vertical scanning period, and
the imaging apparatus outputs two images alternately one by one, after every vertical scanning period, the two images being generated according to the signal charges having different multiplication factors.

10. The imaging apparatus according to claim 8, wherein the control circuit changes the multiplication factor after every other vertical scanning period, and
the imaging apparatus combines two images generated according to the signal charges having different multiplication factors into one image, and outputs the one image.

11. An imaging apparatus, comprising:
a pixel array in which a plurality of pixels are arranged in rows and columns; and
a control circuit, wherein
the pixel array includes:
an avalanche photodiode disposed in a well region;
a charge accumulation portion which accumulates a signal charge generated in the avalanche photodiode;
a reset transistor which initializes the charge accumulation portion;
a transfer transistor which connects the avalanche photodiode and the charge accumulation portion; and
an amplification transistor which converts the signal charge into a voltage, and
the control circuit
controls, on a row basis, a drain potential of the reset transistor, a gate potential of the reset transistor, a gate potential of the transfer transistor, and a potential of the well region.

12. The imaging apparatus according to claim 11, wherein the control circuit compares a threshold set in advance and an output value of an image sensor including the pixel array, and changes a multiplication factor of the signal charge according to a comparison result.

13. The imaging apparatus according to claim 11, wherein an exposure period for the avalanche photodiode is set for each of the rows,
a pixel signal is read for each of the rows after an end of the exposure period, and
between an end of a readout period and a start of a next exposure period, the control circuit changes a multiplication factor of the signal charge.

14. The imaging apparatus according to claim 11, wherein the imaging apparatus outputs two images alternately one by one, after every vertical scanning period, the two images being generated according to the signal charges having different multiplication factors.

15. The imaging apparatus according to claim 11, wherein the imaging apparatus outputs one image resulting from combining two images generated according to the signal charges having different multiplication factors.

16. A camera system, comprising:
the imaging apparatus according to claim 1; and
a signal processing circuit connected to the imaging apparatus, wherein
the signal processing circuit detects illuminance based on an output from the imaging apparatus, and outputs a signal based on the detecting of the illuminance, to the control circuit.

* * * * *